United States Patent [19]
Crane, Jr.

[11] Patent Number: 5,661,631
[45] Date of Patent: Aug. 26, 1997

[54] COMPUTER SYSTEM HAVING COLOR-CODED PRINTED CIRCUIT BOARDS AND CORRESPONDING SLATS

[75] Inventor: Stanford W. Crane, Jr., Boca Raton, Fla.

[73] Assignee: The Panda Project, Boca Raton, Fla.

[21] Appl. No.: 487,104

[22] Filed: Jun. 7, 1995

[51] Int. Cl.⁶ .................................. G06F 1/16; H05K 7/10
[52] U.S. Cl. .......................... 361/683; 361/684; 361/796; 439/488
[58] Field of Search ..................... 361/683, 684, 361/686, 679, 736, 741, 742, 784, 792, 796, 797, 801, 802; 439/488, 489, 491; 209/580; 364/708.1; G06F 1/16

[56] References Cited

U.S. PATENT DOCUMENTS

| | | | |
|---|---|---|---|
| 3,554,429 | 1/1971 | Cohen | 229/15 |
| 3,952,232 | 4/1976 | Coules . | |
| 4,506,785 | 3/1985 | Seefeldt | 206/334 |
| 4,748,540 | 5/1988 | Henneberg et al. . | |
| 4,784,614 | 11/1988 | Sadigh-Behzadi | 439/488 |
| 5,006,959 | 4/1991 | Freige et al. . | |
| 5,216,579 | 6/1993 | Basara et al. . | |
| 5,337,464 | 8/1994 | Steffes | 361/683 |
| 5,455,744 | 10/1995 | Watanabe | 361/801 |

FOREIGN PATENT DOCUMENTS

| | | | |
|---|---|---|---|
| 404042997 | 2/1992 | Japan | 361/802 |
| 404116897 | 4/1992 | Japan | 361/802 |
| WO 88/01127 | 2/1988 | WIPO . | |

OTHER PUBLICATIONS

IBM Technical Disclosure Bulletin, "Segmented Cooling for Personal Computers," vol. 36, No. 10, pp. 431–433, Oct. 1993.

IBM Technical Disclosure Bulletin, D.S. Gaunt et al., "Cooling Electrical Equipment," vol. 20, No. 6, Nov. 1977.

*Primary Examiner*—Michael W. Phillips
*Assistant Examiner*—Lynn D. Feild
*Attorney, Agent, or Firm*—Morgan, Lewis and Bockius, LLP

[57] ABSTRACT

A computer system includes a computer cabinet, a plurality of printed circuit boards housed within the computer cabinet, a processor secured to at least one of the printed circuit boards, a power supply cabinet remote from the computer cabinet, a power supply housed within the power supply cabinet and a signal interconnect unit, coupled to the computer cabinet and the power supply cabinet, for providing an electrical path between the computer cabinet and the power supply cabinet. The printed circuit boards and the slots into which they are inserted have corresponding color code labels. The purpose of this is to clearly identify the location of the slot which corresponds to the printed circuit board of the same color.

10 Claims, 23 Drawing Sheets

COMPUTER SYSTEM HAVING COLOR-CODED PRINTED CIRCUIT BOARDS AND CORRESPONDING SLATS

RELATED APPLICATIONS

The following patent applications are related to the present disclosure and are hereby expressly incorporated by reference:

1) U.S. application Ser. No. 08/381,142 to Stanford W. Crane, Jr. filed Jan. 31, 1995 and entitled HIGH-DENSITY ELECTRICAL INTERCONNECT SYSTEM, which is a continuation of U.S. application Ser. No. 07/983,083 to Stanford W. Crane, Jr. filed Dec. 1, 1992 (now abandoned);

2) U.S. application Ser. No. 08/209,219 to Stanford W. Crane, Jr. filed Mar. 11, 1994 and entitled HIGH-DENSITY ELECTRICAL INTERCONNECT SYSTEM, which is a continuation-in-part of U.S. application Ser. No. 07/983,083 to Stanford W. Crane, Jr. filed Dec. 1, 1992;

3) U.S. application Ser. No. 08/208,877 to Stanford W. Crane, Jr. et al. filed Mar. 11, 1994 and entitled MODULAR ARCHITECTURE FOR HIGH BANDWIDTH COMPUTERS.

4) U.S. application Ser. No. 08/237,366 to Stanford W. Crane, Jr. et al. filed May 3, 1994 and entitled COMPUTER SYSTEM;

5) U.S. application Ser. No. 24/019,780 to Stanford W. Crane, Jr. et al. filed Mar. 11, 1994 and entitled CABINET EXTERIOR;

6) U.S. application Ser. No. 29/019,781 to Stanford W. Crane, Jr. et al. filed Mar. 11, 1994 and entitled COMPUTER CABINET;

7) U.S. application Ser. No. 29/032,765 to Stanford W. Crane, Jr. et al. filed Feb. 14, 1995 and entitled CABINET WITH REVISED EXTERIOR; and 8) U.S. application Ser. No. 29/036,617 to Stanford W. Crane, Jr. et al. filed Feb. 21, 1995 and entitled COMPUTER CABINET.

BACKGROUND OF THE INVENTION

1. Field of the Invention

The present invention relates to a structure of a computer system, and specifically to an arrangement of elements in a computer system to optimize desktop space and to facilitate cooling, shielding, use, access, upgrade, and repair of the computer system.

2. Description of the Related Art

It is desirable to make computers having a small size. One advantage of having a computer with a small size is that more desktop space becomes available to the user. This is particularly important as the number of desktop peripherals available for purchase by the user increases.

As computers become smaller and as greater numbers of components are integrated within the casing of computers, however, the internal structure and layout becomes problematical. As more components are added, for example, servicing and upgrading become more difficult, while the cooling requirements of the computer may increase. Moreover, electromagnetic interference (EMI) may become more difficult to prevent.

In conventional computers, the printed circuit boards (PCBs) that contain a central processing unit (CPU) and its related electronics, as well as memories, and peripheral devices, such as hard disk drives and floppy disk drives, are housed in a single enclosure, devoid of internal partitions. All the elements that make up the computer reside in a single open area within the casing of the computer, containing only brackets necessary to support the components. There is generally no structure to effectively separate the internal elements from one another or to prevent heat and electromagnetic radiation generated by the components from affecting the other elements within the enclosure. The inclusion of the power supply for the computer system within the same enclosure as the CPU, its related electronics, the memories, and peripheral devices, only adds to the heating and EMI problems.

In addition, conventional computers are often not designed with ease of access for upgrade and repair. What is needed is a computer that is designed to optimize desktop space and to facilitate cooling and shielding and that is designed so that its various components are easily accessible during upgrade and/or repair.

SUMMARY OF THE INVENTION

The present invention overcomes the problems and disadvantages of the prior art by incorporating structure that partitions the computer into a desktop unit, a power supply unit remote from the desktop unit, and a signal interconnect unit coupling the desktop and power supply units. The desktop unit of the invention is designed to facilitate cooling and includes components that act as an EMI shield. In addition, the desktop unit of the invention includes a hinged drive section for access to one or more of the printed circuit boards and color coded components facilitating replacement of the printed circuit boards when performing upgrades and/or repairs.

In accordance with the purpose of the invention, as embodied and broadly described herein, the invention includes a computer system comprising a computer cabinet; a plurality of printed circuit boards housed within the computer cabinet; a processor secured to at least one of the printed circuit boards; a power supply cabinet remote from the computer cabinet; a power supply housed within the power supply cabinet; and a signal interconnect unit, coupled to the computer cabinet and the power supply cabinet, for providing an electrical path between the computer cabinet and the power supply cabinet.

In further accordance with the purpose of the invention, the invention includes a computer system comprising a computer cabinet having a top, a bottom, a front, a back, and sides; a plurality of printed circuit boards enclosed within the computer cabinet; at least one disk drive substantially enclosed within the computer cabinet at a position located above the printed circuit boards; at least one air intake located at the bottom of the computer cabinet; and a fan disposed near the top and back of the computer cabinet at a back side of the at least one disk drive for drawing air up from the at least one air intake, past the printed circuit boards and the at least one disk drive, and out through the back of the computer cabinet.

In still further accordance with the purpose of the invention, the invention includes a computer system comprising a computer cabinet; a card cage located within the computer cabinet and having a plurality of slots; a plurality of printed circuit boards removably secured to the slots of the card cage, respectively, each of the printed circuit boards being marked with at least one indicator identifying a color uniquely associated with that printed circuit board; and color code means identifying a one-to-one correspondence between the slots of the card cage and the colors associated with the printed circuit boards to facilitate securement of each printed circuit board associated with a given color to the one of the slots corresponding to that color.

In yet still further accordance with the purpose of the invention, the invention includes a computer system comprising a computer cabinet; a frame substantially enclosed within the computer cabinet, the frame comprising a printed circuit board section and a drive section located above the printed circuit board section; a plurality of printed circuit boards substantially enclosed within the printed circuit board section of the frame; at least one disk drive substantially enclosed within the drive section of the frame; and a pivot device coupling the drive section and printed circuit board section to allow pivoting of the drive section, with respect to the printed circuit board section, between an open position and a closed position, the open position corresponding to a state wherein the drive section is pivoted away from the printed circuit board section to allow access to the printed circuit boards substantially enclosed within the printed circuit board section, and the closed position corresponding to a state wherein the drive section rests above the printed circuit board section with a floor of the drive section functioning as a lid of the printed circuit board section.

Additional features, purposes, and advantages of the invention will be set forth in part in the description which follows, and in part will be obvious from the description, or may be learned by practice of the invention. The features, purposes, and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate an exemplary embodiment of the invention and together with the description, serve to explain the principles of the invention.

In the drawings.

DESCRIPTION OF EXEMPLARY EMBODIMENT

Reference will now be made in detail to the present exemplary embodiment of the invention, an example of which is illustrated in the accompanying drawings. Wherever possible, the same reference numbers will be used throughout the drawings to refer to the same or like parts.

General Description

The invention relates to an enclosure for the electronic components that make up a computer and the arrangement of the electronic components within the enclosure. The principal elements in the computer (printed circuit boards (PCBs), internal drives, externally accessible drives and power supply) are arranged relative to one another in a manner that optimizes cooling, accessibility, and EMI (electromagnetic interference) shielding effectiveness. The location of these elements relative to air vents and fans, relative to each other, the way the elements are supported and accessed, and the method used for EMI shielding, are unique aspects of this design. The organization of the parts and the relationship that it has to the usability of the system by an operator is also unique. The computer system of the invention incorporates a card cage accommodating double-sided backplanes and other backplane/PCB configurations.

Figure 1:
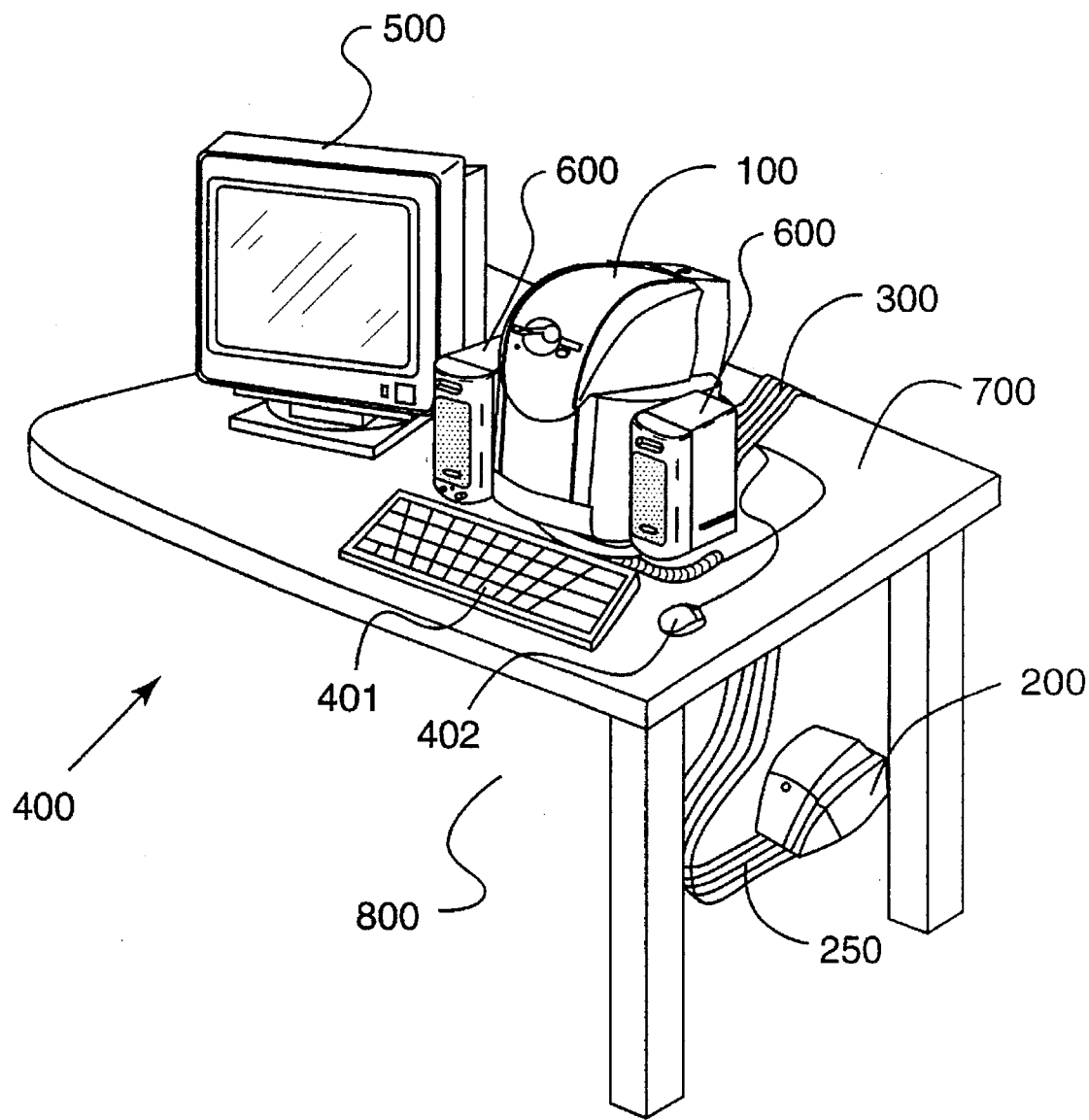
FIG. 1 is a perspective view showing components of a computer system in accordance with the present invention, including a desktop unit (DTU), a signal interconnect unit (SIU), and a power supply unit (PSU).

FIG. 1 is a perspective view showing components of a computer system 10 in accordance with the present invention. The components of computer system 10 are preferably arranged into three distinct locations and groups. More particularly, computer system 10 comprises a desktop unit (DTU) 100, a power supply unit (PSU) 200, and a signal interconnect unit (SIU) 300 forming an electrical path between DTU 100 and PSU 200. Computer system 10 also preferably comprises at least one input means 400, such as a keyboard 401 and/or a mouse 402, and a display terminal 500, and may also comprise one or more speakers 600 positioned, for example, near DTU 100.

In an arrangement corresponding to a preferred desktop embodiment, DTU 100 and all other desktop peripherals (such as input means 400, display terminal 500, and speakers 600) reside on a top surface of a desk 700, PSU 200 resides on a floor 800 beneath the desk, and SIU 300 couples DTU 100 to PSU 200, as shown in FIG. 1. The grouping of the components shown in FIG. 1 is determined by key usability and aesthetic factors. A brief description of the components depicted in FIG. 1 follows, with more detailed information on such components being set forth in their respective individual sections below.

DTU 100 is designed for convenience of the user in that it requires significantly less desktop space than a conventional desktop personal computer. DTU 100 is intended to be placed in close proximity with keyboard 401 and display unit 500 and to provide easy access to the most often used features of the system. The diskette drive, CD-ROM drive, power controls, and indicator lights are examples of devices that are used daily and must have high usability features. Because of the proximity of DTU 100 to other desktop devices such as the keyboard 401 and display unit 500, signal cable ports for these desktop peripheral devices are provided at the back of the DTU.

PSU 200 is designed for the convenience of the user in that it is not required to be accessed on a daily basis and, therefore, is intended to be installed on floor 800, preferably in an out-of-the-way location. PSU 200 contains the DC power source for DTU 100 as well as most of the cable input/output ports found in a personal computer installation. These ports are housed in PSU 200 because they are most often connected to other devices that may not be located on the same desktop as DTU 100 and, once connected, are rarely disconnected.

SIU 300 is a unique device in its concept and construction in that it is a very high density cable that provides the electrical path between DTU 100 and PSU 200. While providing the interconnect function, SIU 300 also provides for a decorative function by organizing the normal clutter of input/output (I/O) cables into a single, attractive, flat ribbon structure.

Desktop Unit (DTU) 100

Figure 2:
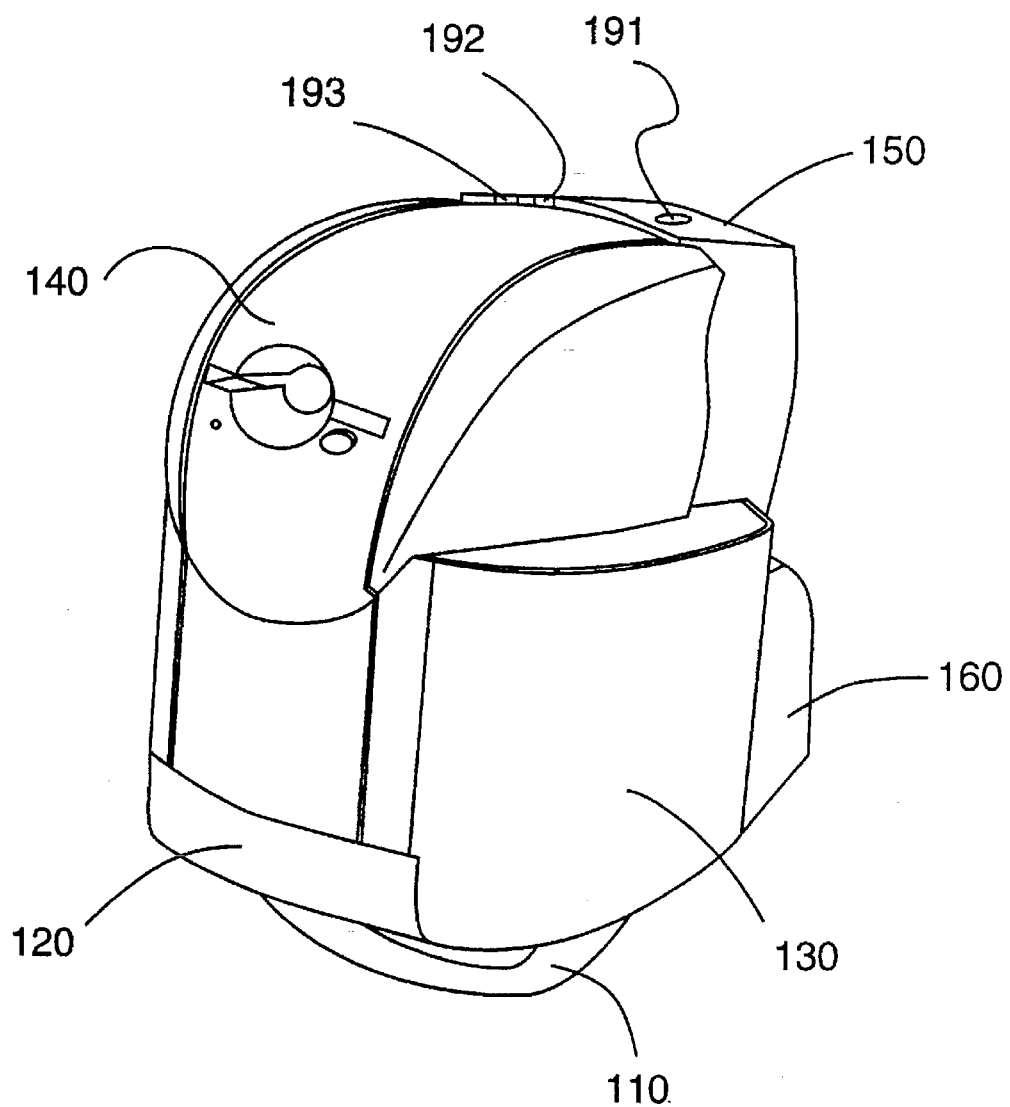
FIG. 2 is a front perspective view of the DTU with its CD-ROM drive in a retraction state.

DTU 100 comprises six major sections and is arranged in that fashion to optimize the electrical design, user access, electromagnetic compatibility, thermal management, and serviceability of the unit. With reference to FIG. 2, the six major sections of DTU 100 are the pedestal or base 110, the compact disk read only memory (CD-ROM) section 120, the card cage 130, the direct access storage devices (DASD) section 140, the cooling section 150, and the input/output (I/O) section 160. The way in which these sections operate together is one of the unique characteristics of DTU 100.

Pedestal 110 is unique in the way that it presents DTU 100 to the user. As seen most clearly in FIG. 3A, pedestal 110 provides a slope which optimizes user access of the CD-ROM disk 121 and floppy disk 141 media and ensures that the location of keyboard 401 and/or other desk clutter is not critical in the insertion or ejection of the disks. As seen from FIG. 3A, for example, the slope provided by pedestal 110 is preferably significant enough so that CD-ROM disk tray 122 will clear at least keyboard 401 when in its ejection state.

Figure 3A:
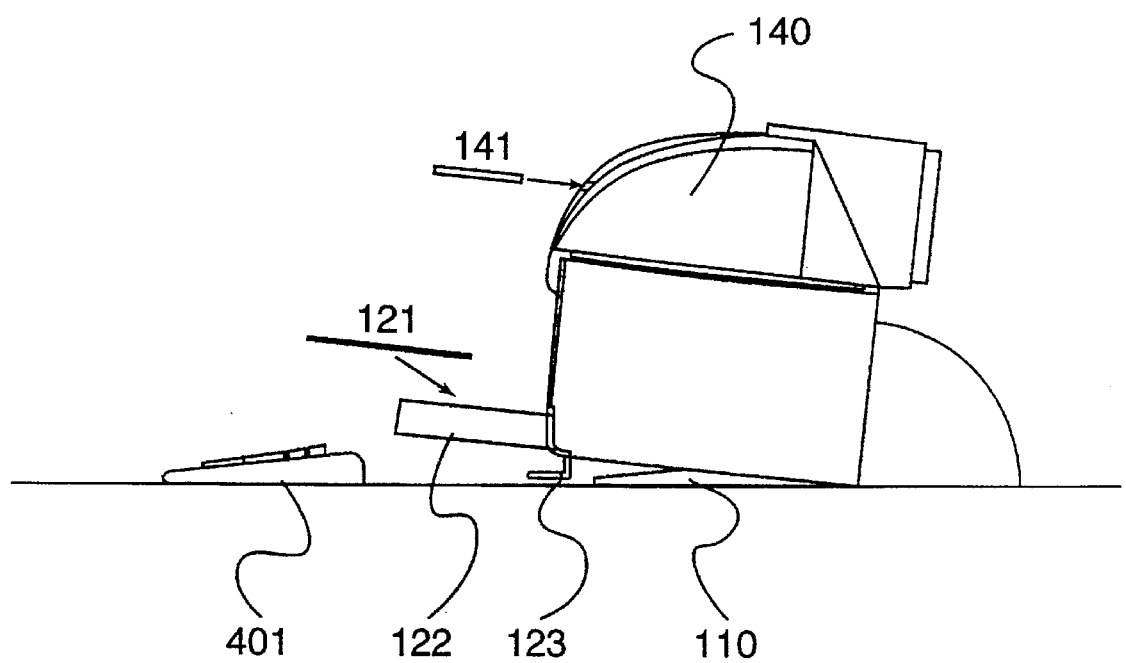
FIGS. 3A and 3B are side and front perspective views, respectively, of the DTU with its CD-ROM drive in an ejection state.

CD-ROM section 120 is preferably located in the lower portion of DTU 100 and provides a number of unique features. As an example, this section incorporates a decorative door 123 that is hinged in a fashion which utilizes electronic control of CD-ROM disk tray 122 as a mechanism for opening the door. In this respect, DTU 100 incorporates a CD-ROM drive (only the CD-ROM disk tray 122 of the drive is shown in FIG. 3A) preferably utilizing a motor drive to eject the CD-ROM disk tray and also to draw the tray into the unit. Under software control, through the system electronics and operating system of computer system 10, the user has control of CD-ROM disk tray 122 by utilizing commands input using mouse 402 and/or keyboard 401. When the proper command is issued, the CD-ROM drive will present disk 121 to the user by ejecting CD-ROM disk tray 122 and, thus, causing decorative door 123 to be pushed open. The ejected tray holds door 123 open until another command from mouse 402 and/or keyboard 401 causes the tray to be drawn into the CD-ROM drive, thereby allowing the door to close.

Figure 3B:
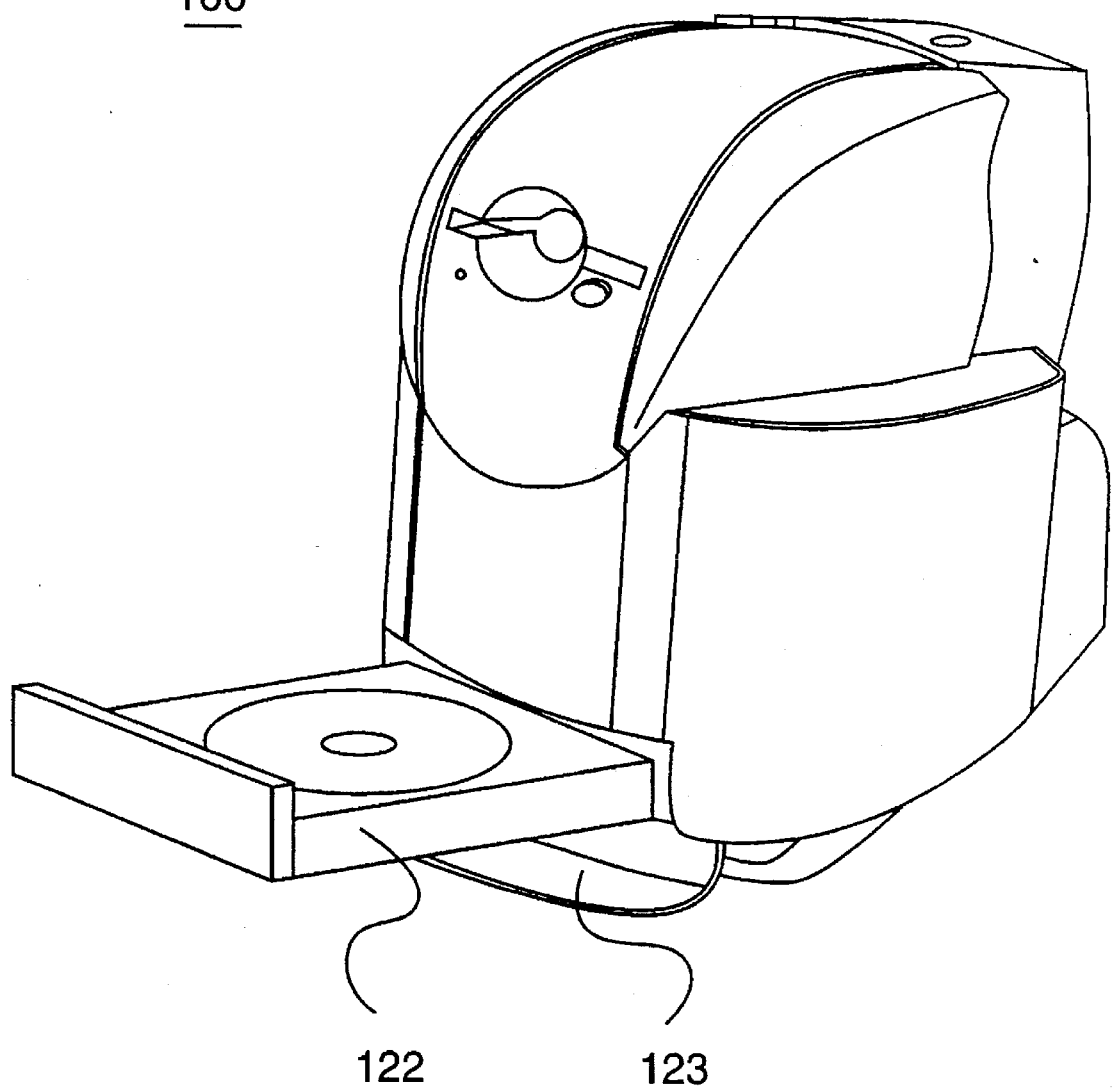
Figure 4:
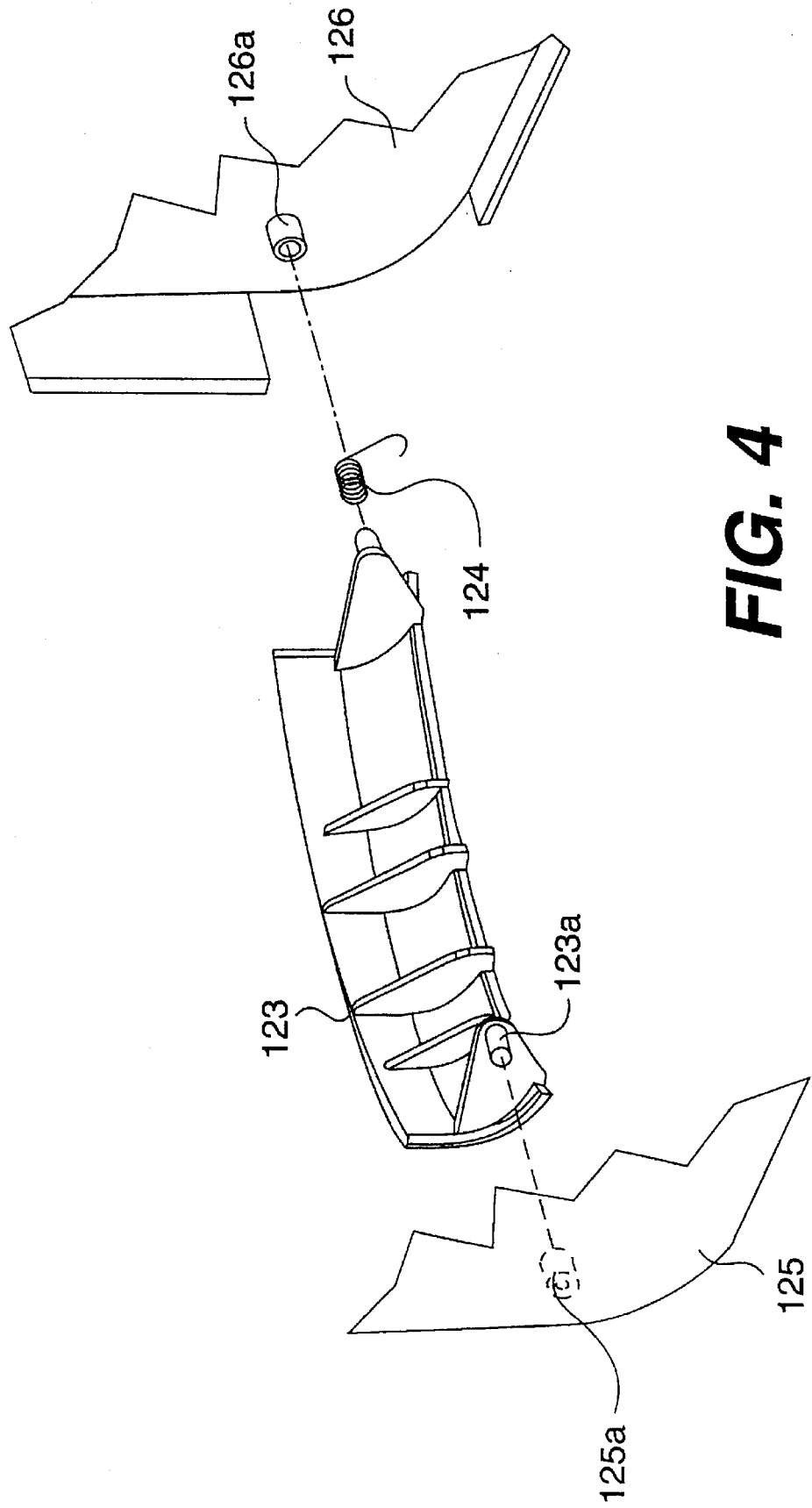
FIG. 4 is an exploded view of a CD-ROM door of the CD-ROM drive of the DTU.

FIG. 2 shows the door mechanism in the closed position. FIGS. 3A and 3B show the door mechanism in the open position. FIG. 4 shows details of the door mechanism design. As can be seen from FIG. 4, the CD-ROM door mechanism of DTU 100 includes CD-ROM door 123, a return spring 124, a right-side panel 125 of the DTU including a receiving-type peg 125a, and a left-side panel 126 including a receiving-type peg 126a. CD-ROM door 123, in turn, includes a projection-type peg 123a received within receiving-type peg 125a and a projection-type peg 123b extending through return spring 124 and received within receiving-type peg 126b. Return spring 124 biases CD-ROM door 123 toward its closed position in the absence of an eject command from mouse 402 and/or keyboard 401.

Figure 5A:
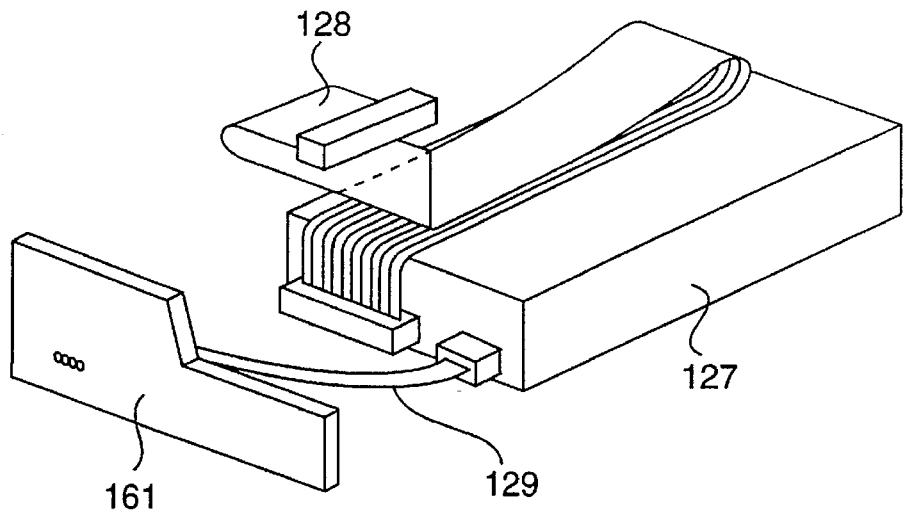
FIGS. 5A, 5B, and 5C are different perspective views showing an arrangement of signal cable and power cable feeds for the CD-ROM drive of the DTU.
Figure 5B:
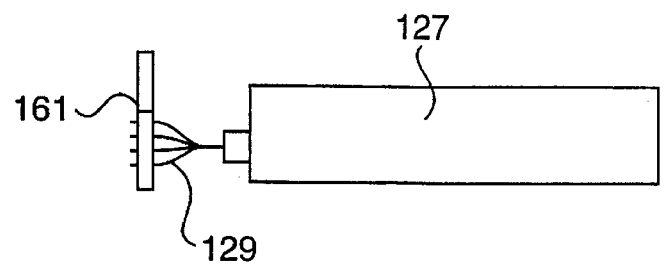

Another unique feature of CD-ROM section 120 is the arrangement of the signal cable and power cable feed to the CD-ROM drive. This feature of CD-ROM section 120 is best understood from FIGS. 5A, 5B, and 5C which are, respectively, front perspective, side, and back views of the CD-ROM drive 127, signal cable feed 128, and power cable feed 129, of CD-ROM section 120; system backplane 131 of card cage section 130; and input/output (I/O) board 161 of I/O section 160. Signal cable feed 128 and power cable feed 129 are unique in their length because of the overall placement of CD-ROM section 120 in relation to main system backplane 131 and system I/O board 161. In a conventional computer, the location of the CD-ROM drive forces a much greater cable length and causes subsequent electrical interference and signal degradation.

Yet another unique feature of CD-ROM section 120 is that the CD-ROM section is completely enclosed on five of its six sides (i.e., it is enclosed on all of its sides except the front) by metal separating CD-ROM section 120 from card cage section 130. This prevents electrical signal interference (e.g., EMI) between sections and also prevents the escape of EMI signals to the surrounding environment. In previous implementations of personal computers, elements of the system were housed within the same enclosure without shielding between sections, thereby increasing the likelihood of performance degradation resulting from EMI.

Figure 6A:
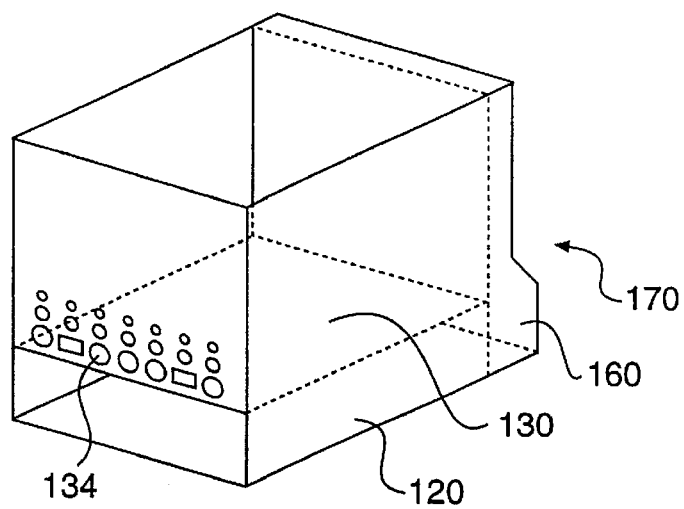
FIGS. 6A, 6B, and 6C are front, back, and top perspective views of a portion of a metal enclosure contained within the DTU.
Figure 6B:
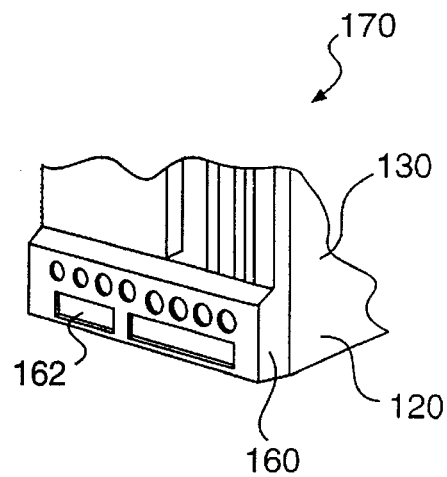
Figure 6C:
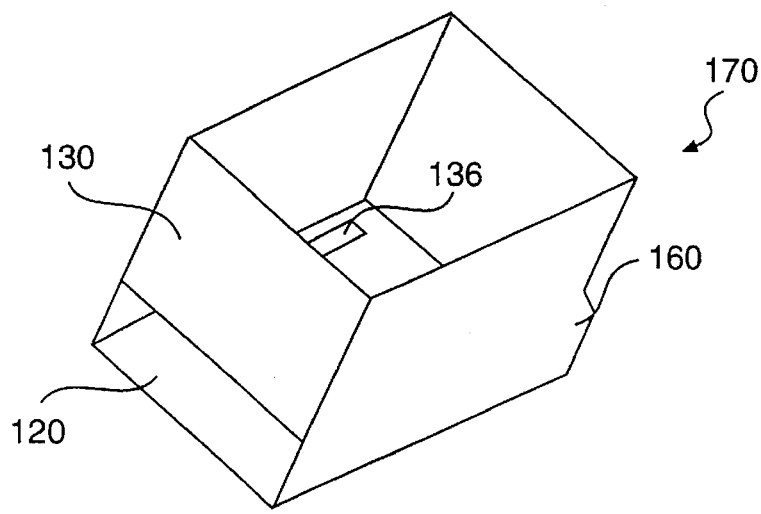
Figure 7:
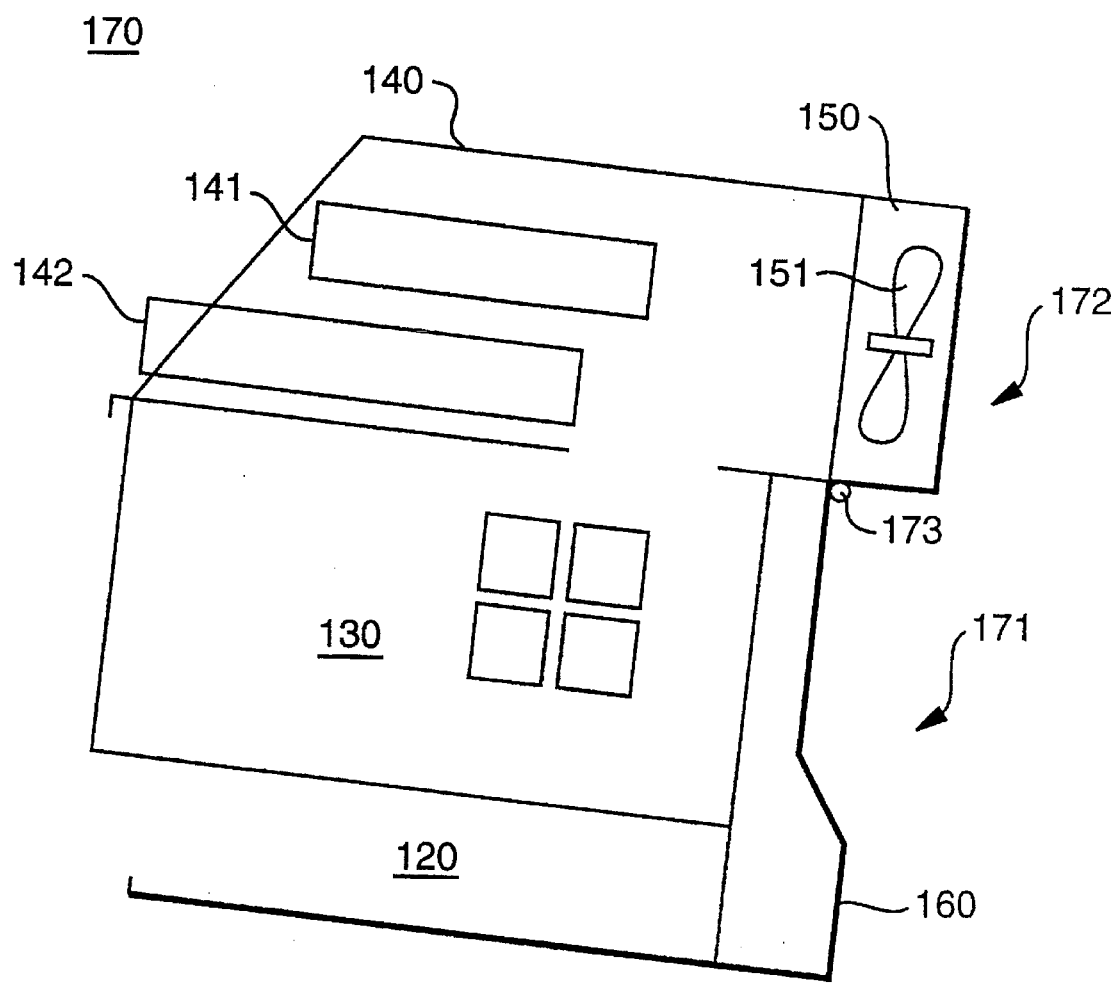
FIG. 7 is a side view of the metal enclosure of the DTU showing various components enclosed and/or partially enclosed within the metal enclosure.

The aforementioned shielding between sections is preferably accomplished using a conductive enclosure such as the metal frame or enclosure 170 partially depicted in FIGS. 6A, 6B, and 6C, and more fully depicted in FIG. 7. As can be understood from FIG. 7, metal enclosure 170 includes a lower section 171 associated with CD-ROM section 120, with card cage section 130, and with I/O section 160; an upper section 172 associated with DASD section 140 (including fixed disk or hard disk drive 141 and floppy disk drive 142) and with cooling section 150 (including fan 151); and a pivot device comprising a spring-loaded hinge 173 allowing upper section 172 to pivot or hinge open with respect to lower section 171.

As a part of the overall thermal management of DTU 100, CD-ROM section 120 provides a path for air flow to enter the DTU through a space under decorative door 123 and then routes the air through this section and passes the air into the bottom of card cage section 130 through strategically placed slots. The length and orientation of these slots is designed to minimize EMI through selection of dimensions that provide a minimum frequency threshold below which no emissions will take place.

Card cage section 130 includes system backplane 131, discussed above in connection with FIG. 5C, as well as a plurality of PCBs removably connected to the backplane by pluggable connectors or other suitable means. The PCBs housed within card cage section 130 may include, for example, at least one microprocessor card having a microprocessor secured thereto, at least one memory card, and at least one peripheral controller card.

Figure 5C:
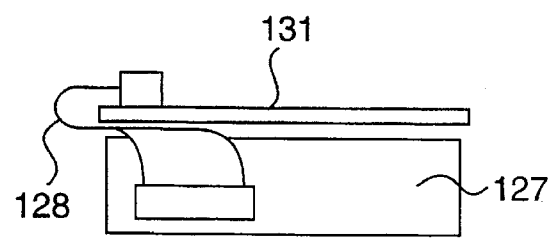

Preferably, backplane 131 is arranged horizontally within card cage section 130 in the manner depicted in FIG. 5C, and the PCBs of the card cage section are arranged perpendicularly (i.e., vertically) with respect to the backplane. The PCBs are arranged vertically so that hot air generated by the electronic components secured to the PCBs is allowed to rise to the top of the card cage enclosure and is drawn out by fan 150 (FIG. 7) of cooling section 150 located near the top and back of DTU 100. This arrangement allows air to exhaust via vents located at the top rear of the DTU. The vertical orientation of the PCBs allows the hot air created by the heat generated from the electronic components on the PCBs, to naturally rise to the top of the card cage and be exhausted. Air intake to card cage section 130 is via the bottom, sides, and front of the card cage. Plastic decorative outer panels of DTU 100 insure that cool air is drawn in from the exterior of the DTU. Strategically placed inlet ports direct the air flow and force hot air to be flushed from the different sections of card cage enclosure 130.

The PCBs are arranged vertically with the cable connections for externally accessible cables (I/O cables) located at the back of card cage section 130 where they may be easily accessed by the user. A unique aspect of the design of the card cage is that the function of the individual PCBs is depicted by a color code. More particularly, each of the individual printed circuit cards is manufactured in a different color material rather than adopting the traditional method of making each card green. As an alternative to manufacturing each of the cards in a different color material, or in addition to such manufacture, each of the cards may have text printed on the card identifying the particular color assigned to that card. The color code for each card is reflected in the user documentation and also in one or more information labels attached within DTU 100 (e.g., within the card cage). The purpose of this is to clearly identify in an unambiguous way the location of cards relative to their intended location. In this manner, errors in service due to cards being inserted into wrong locations is, for all practical purposes, eliminated.

Figure 8:
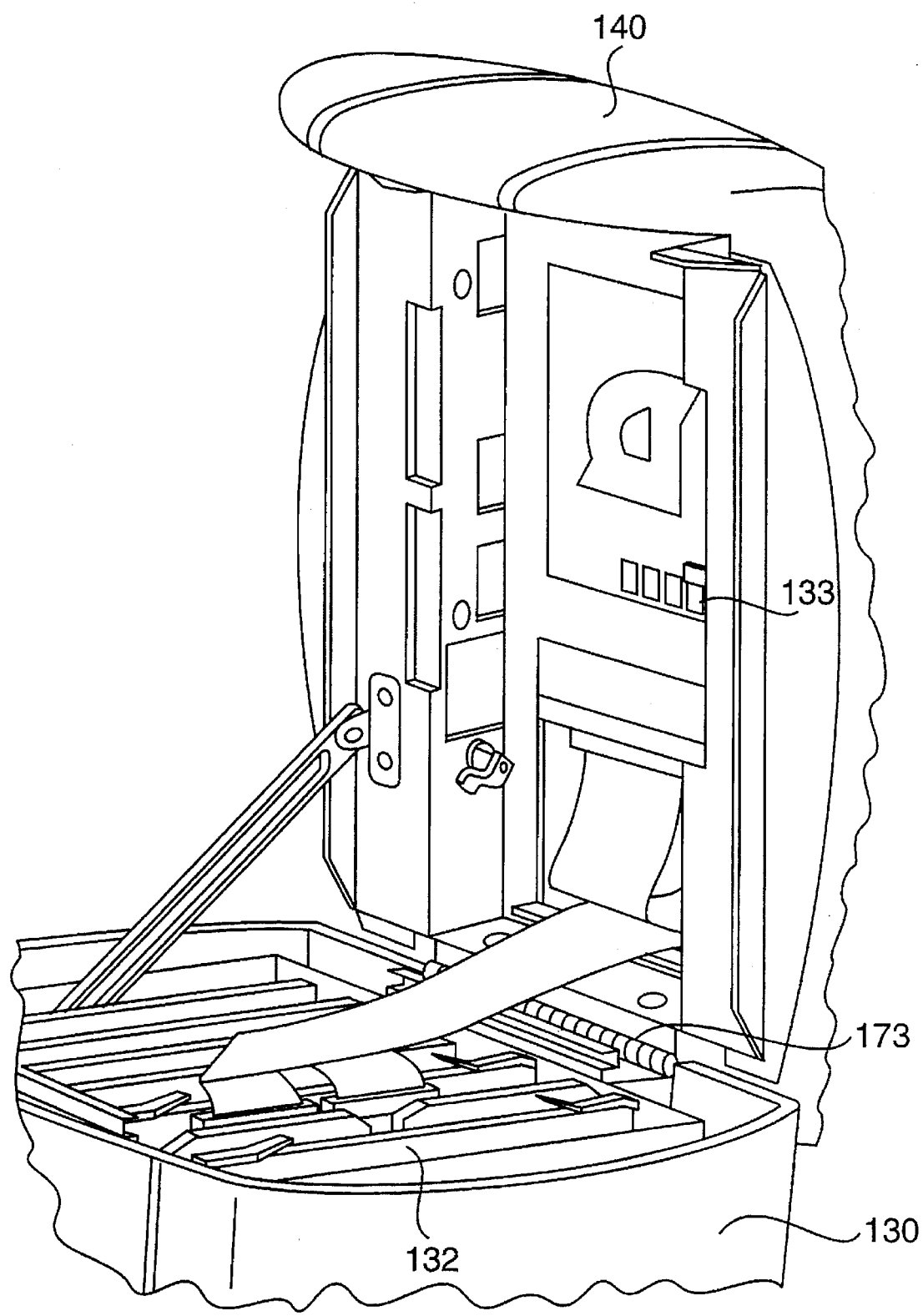
FIG. 8 is a partial perspective view of a color code scheme and hinge arrangement associated with the DTU.

An exemplary embodiment of the color code scheme of the present invention will now be discussed with reference to FIG. 8. In the position depicted in FIG. 8, DASD section 140 is pivoted open to provide access to a plurality (e.g., seven) of PCBs 132 housed within card cage section 130. The plurality of PCBs 132 may include, for example, a microprocessor board containing a microprocessor, a memory board, and a peripheral controller board. It should be understood that, although FIG. 8 shows seven PCBs, any number of PCBs may be included in the computer system in accordance with the invention.

Each of the PCBs 132 may have a different color and/or text written thereon identifying the color associated with that PCB. Additionally, a card color code label 133 is provided in visual proximity with respect to PCBs 132 (for example, inside the top of the card cage adjacent the cards). Label 133 identifies a one-to-one correspondence between the slots of the card cage in which the PCBs 132 reside and the colors associated with the PCBs. For example, label 133 may include a plurality of colored squares with the leftmost square being the color assigned to the leftmost slot, the second leftmost square being the color assigned to the second leftmost slot, and so on. The color of each card 132 matches the color of the slot in which it should reside. Thus, when a PCB 132 having a given color is to be replaced, either for repair or upgrade purposes, the PCB is removed and the slot into which the replacement board (which also has the given color) is to be inserted is determined by matching the given color of the replacement board with one of the colored squares on label 133, and then inserting the replacement board into the slot corresponding to the one of the colored squares having the given color. As an example of the colors which may be assigned to the boards, the microprocessor board may be red, the memory board may be white, and the peripheral controller board may be blue.

In another embodiment, each of PCBs 132 may include a graphic symbol (such as a heart, a diamond, a spade, or the like) printed thereon in addition to being designated by one or more of the aforementioned color indicia. This would be useful in cases where, for example, the red microprocessor board produced by a first manufacturer is not a suitable replacement for the red microprocessor board produced by a second manufacturer. By making sure that each replacement board matches the board it is replacing in both color and graphic symbol, the user can avoid erroneous board replacements which, of course, are undesirable. The graphic symbol may be used to represent the manufacturer and/or the version of a given board, and if the color and graphic symbol of one board do not match the color and graphic symbol of another board, respectively, then such boards are not suitable replacements for one another.

Card cage section 130 is designed to provide shielding against electromagnetic radiation that may be generated by the PCBs 132 within the unit or shield against EMI that may enter the enclosure from an external source. The shielding is required to comply with Federal Communications Commission (FCC) regulations. The card cage is made of steel, as is the rest of metal enclosure 170, and open areas are designed with minimum dimensions in order to set the cutoff frequency below which signals will not be radiated into or out of the enclosure. These openings also allow for ample air intake and exhaust, thus providing an enclosure sealed against EMI and thermally efficient for optimize cooling of internal parts.

As can be understood from FIG. 8, the bottom surface of DASD section 140 acts as a lid for card cage section 130, thereby completely enclosing PCBs 132 on six sides. In order to provide user access to the card cage for the purpose of maintenance or product upgrades, the top of card cage section 130 (i.e., the bottom of DASD section 140) is attached to the card cage by use of spring-loaded hinge 173. The metal bottom of DASD section 140 makes up the EMI barrier between card cage section 130 and DASD section 140 and, thus, it becomes the lid of the card cage. Spring-loaded hinge 173 provides an opening bias to the lid but is not strong enough to completely lift the weight of the lid when in the fully closed position. This provides a measure of safety in that it prevents rapid closure of the lid as well as improves usability in that it assists the user in the act of opening the lid.

Figure 9:
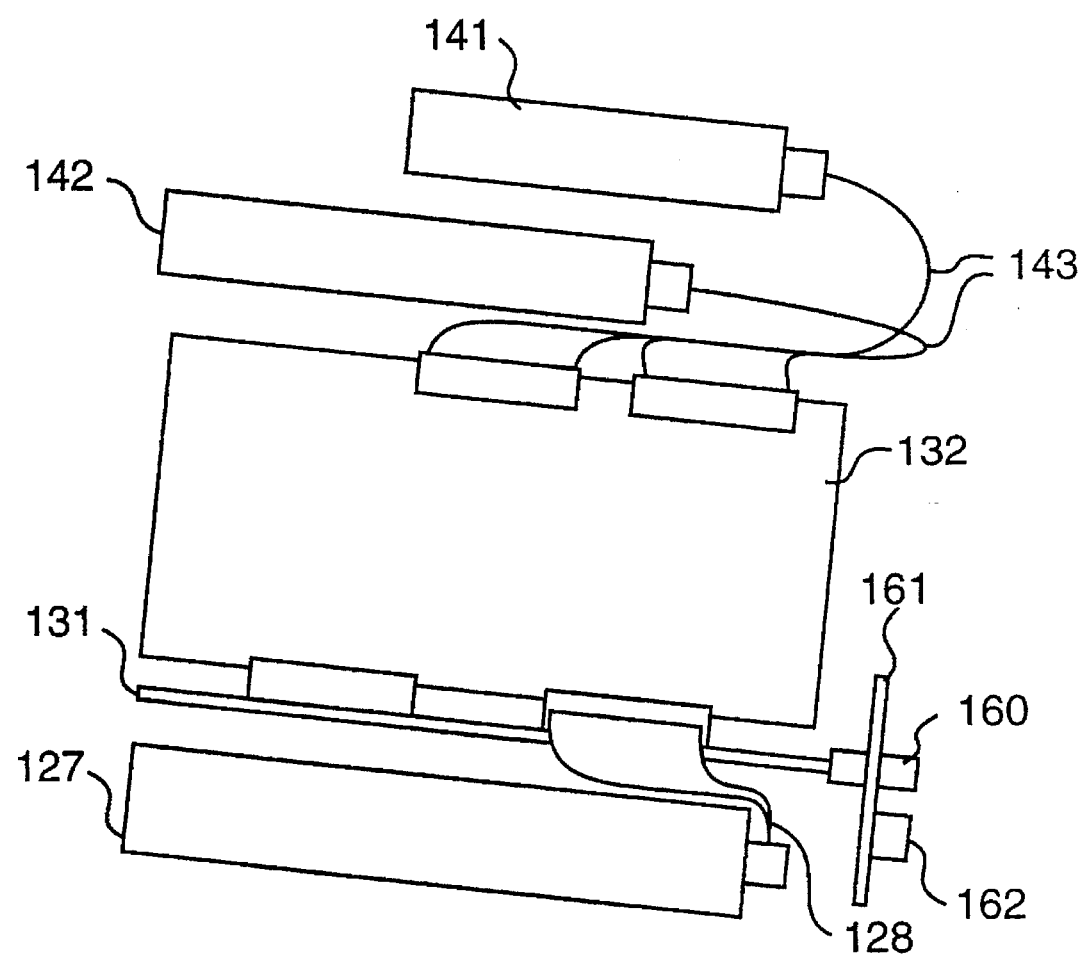
FIG. 9 is a side view of a cable routing scheme incorporated within the DTU.

FIG. 9 depicts the cable routing within the DTU structure. The connectors providing I/O signals to the card cage are organized to minimize cable length. All signals between the cards 132 within card cage section 130 that are intended to exit DTU 100 via I/O connectors 162 of I/O section 160 or are intended to be connected to CD-ROM section 120 are routed to the bottom of the cards, through backplane 131 and thus to their destination. Signals that are routed to DASD section 140 from cards 132 are wired to the top of the appropriate card and, from there, are cabled via disk drive cables 143 to the appropriate one of disk drive 141 and disk drive 142. This makes for the shortest possible signal path and results in the most reliable design with the least amount of electrical interference.

Figure 10:
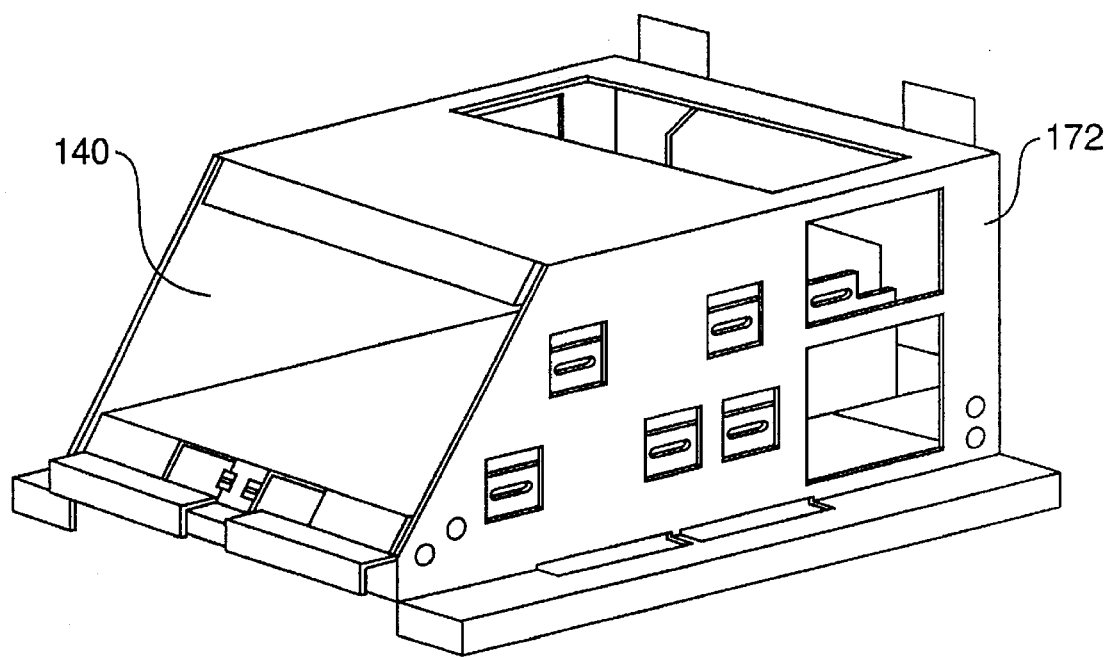
FIG. 10 is a front perspective view of a direct access storage devices (DASD) section of the metal enclosure of the DTU.
Figure 11:
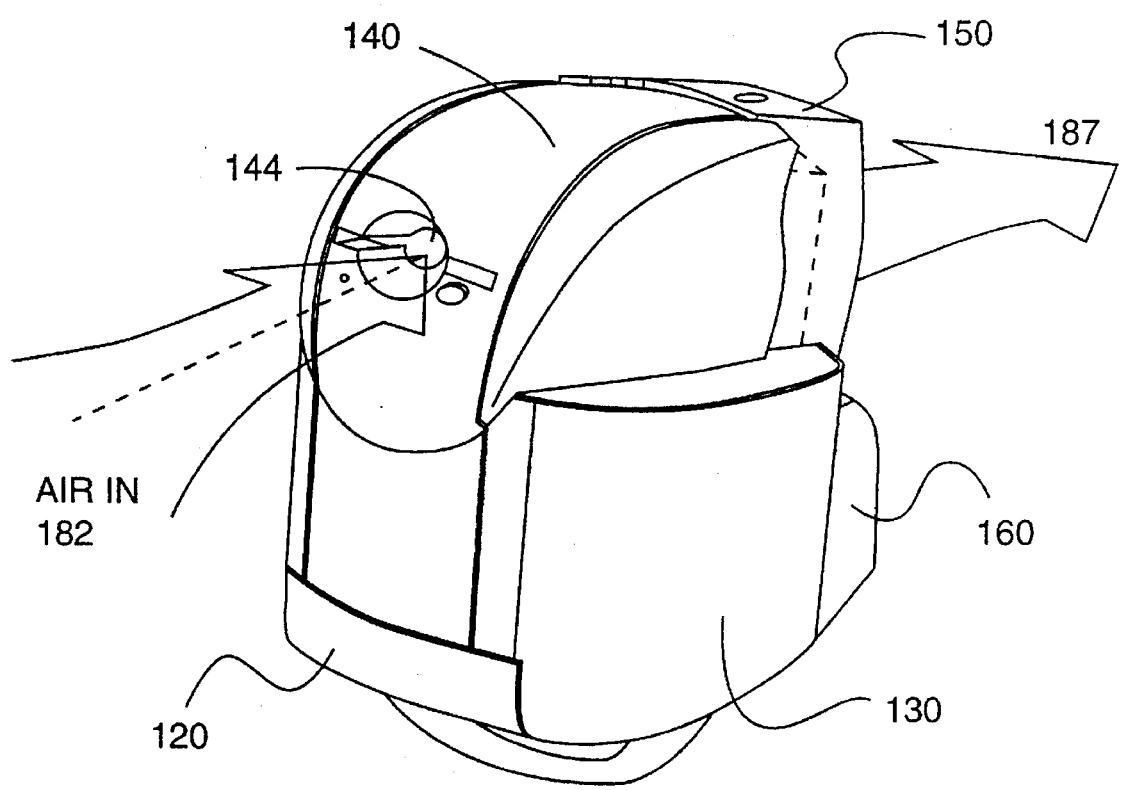
FIG. 11 is front perspective view of the DTU showing an air flow path through the DASD section.

Fixed disk drive 141 and floppy disk drive 142 are located at the top of DTU 100 in a separate DASD section that is thermally and electrically isolated from the rest of the unit. This design implementation furthers the EMI and thermal control concept by isolating sections of DTU 100 for maximum EMI shielding and air flow control to maximize cooling performance. Although a single fixed disk drive 141 and a floppy disk drive 142 are depicted in the exemplary embodiment of the invention, it should be noted that DASD section 140 can be configured to incorporate multiple fixed or hard disk drives and/or multiple floppy disk drives of various heights and sizes. As an example, 3.5 inch half height drives, 3.5 inch full height drives, 5.25 inch half height drives, and 5.25 inch full height drives, are all contemplated. FIG. 10 shows the hinged portion 172 of metal enclosure 170 that makes up DASD section 140. FIG. 11 shows the air path that provides cooling to the DASD section.

As seen from FIG. 11, cooling section 150 of DTU 100 is located at the top rear of the unit. It contains an electric fan 51 (see FIG. 7) that is controlled by electronic circuits to minimize noise by decreasing fan speed in cool environments and to maximize cooling effectiveness by increasing fan speed as the environment increases in temperature. The sections of DTU 100 are organized to make use of the cooling capabilities of fan 151 to the maximum extent possible.

Figure 12:
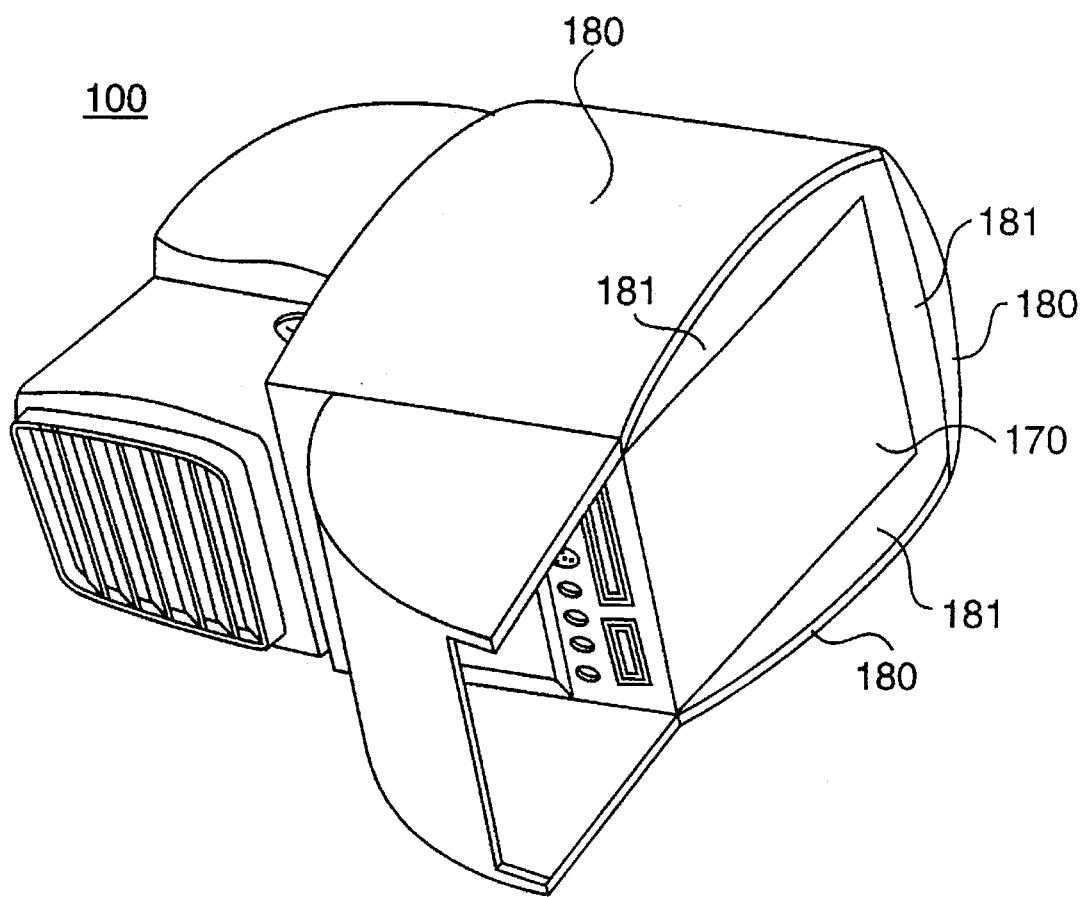
FIG. 12 is a bottom perspective view showing various air intakes of the DTU.

Air flow into DTU 100 is controlled by vents located at the periphery of the DTU near the desk surface. The non-pedestal portion of DTU 180 (i.e., its casing) is spaced above the desktop by pedestal 110 (see FIG. 2), which allows free air flow into the front and sides of the unit. This cool room air is routed by decorative plastic outer covers 180 into the air flow passages in the inner metal structure 170. FIG. 12 shows the air intake areas 181 of DTU 100 viewed from the bottom surface of the unit.

Figure 13:
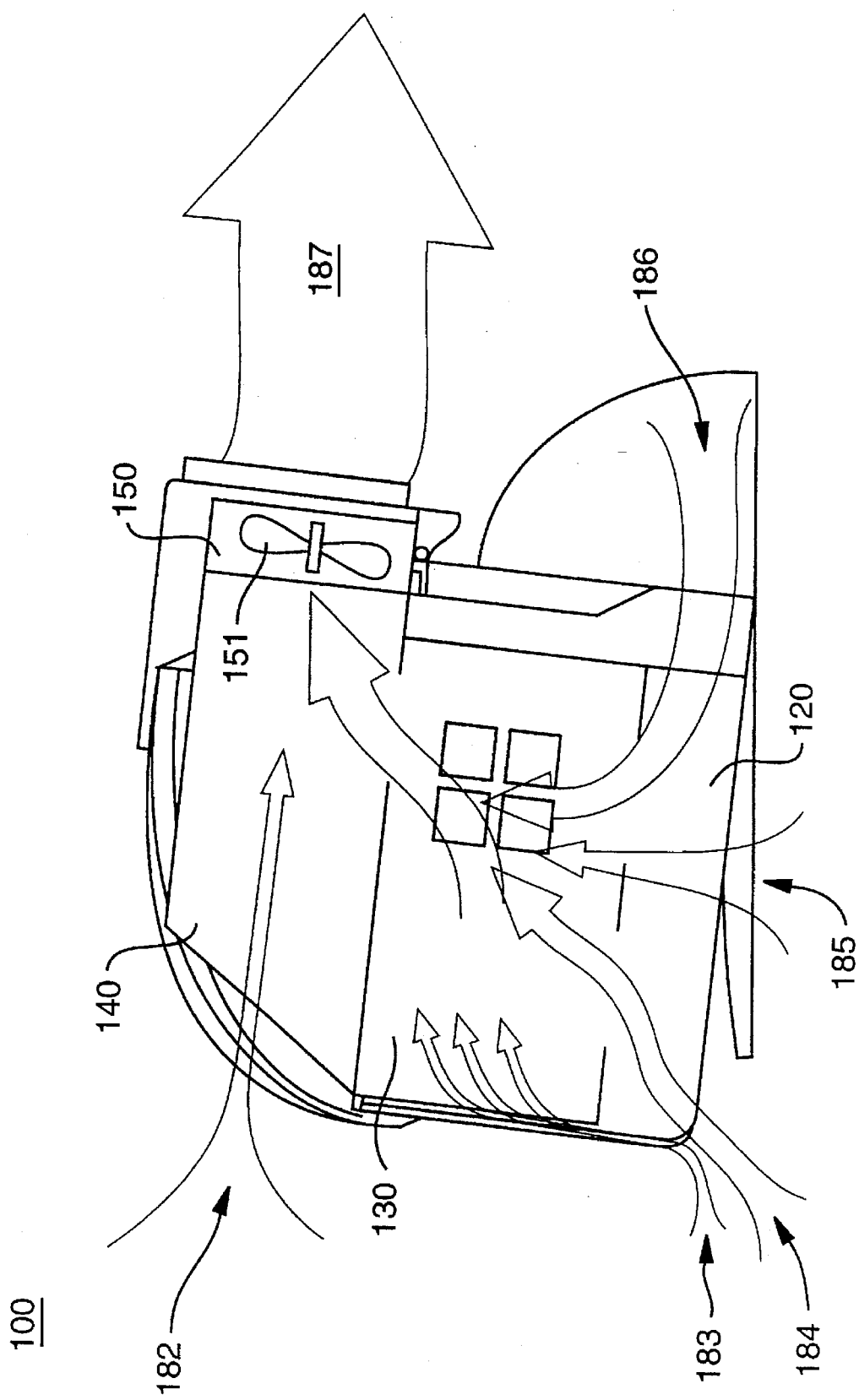
FIG. 13 is a side view showing various air flow paths associated with the DTU.

FIG. 13 is a view of the air flow through DTU 100 from various entry points, including intake areas 181, through CD-ROM section 120, through card cage section 130, through DASD section 140, and out an exhaust outlet of cooling section 150. The air flow of FIG. 13 includes a DASD cooling air flow path 182, a card cooling air flow path 183, a CD-ROM and card cooling air flow path 184, a CPU cooling air flow path 185, a CD-ROM and CPU cooling air flow path 186, and an exhaust air flow path 187. One unique feature of such directed cooling is that, unlike conventional personal computers, it is highly unlikely, if not impossible, to block any of the air inlet or outlets paths of DTU 100. In conventional computers, the placement of documents, peripheral devices such a monitors or printers, and other types of normal desktop clutter, may block air flow to the point of causing serious overheating of internal devices. Overheating can seriously shorten the life of these components and cause premature failure of the system. Placement of air inlets and outlets of DTU 100 is carefully planned to minimize or eliminate this condition. Multiple inlets ports for redundancy with placement to minimize the chance of blockage and a high position for the outlet are further design points that add to the uniqueness of this design.

Figure 14:
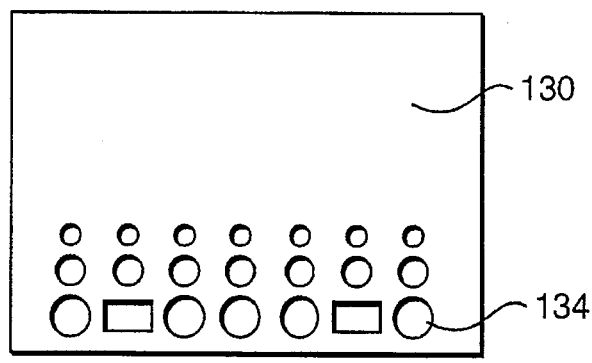
FIGS. 14, 15, and 16 are front, side, and top views, respectively, showing a card cage section of the metal enclosure of the DTU.

FIG. 14 shows air inlets 134 in the front of card cage section 130. These ports are made up of graduated size holes in order to direct the maximum air flow into the lower part of the air flow path with progressively less air into the area near the top of the cards. This maximizes the flow of cool air where it is needed the most. Ports 134 are located so that each vertical column of holes is positioned between individual cards. This directs the air flow into the card cage and forces conduction between each card balancing the cooling to each card.

Figure 15:
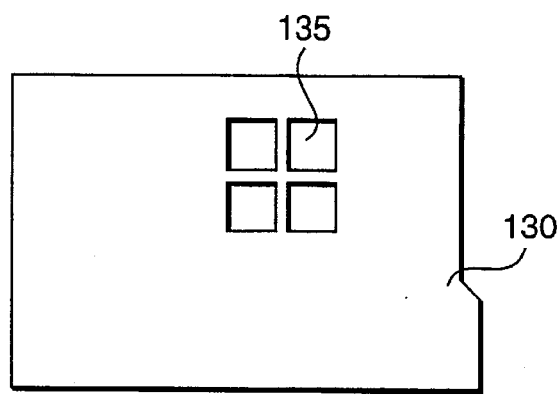

FIG. 15 is a side view of card cage 130 showing a number (e.g., four) of air inlets 135 intended to direct air into the card cage immediately opposite the location of the processor chip. For this to occur with optimum results, the PCB holding the processor chip is preferably the outermost PCB closest to air inlets 35. The processor chip requires the maximum amount of cooling of all chips within the system and, typically, other conventional personal computers will have an auxiliary fan mounted directly on the chip heat sink. With the directed cooling available in DTU 100, however, the need for this additional fan, and thus the cost of this fan, is eliminated.

Figure 16:
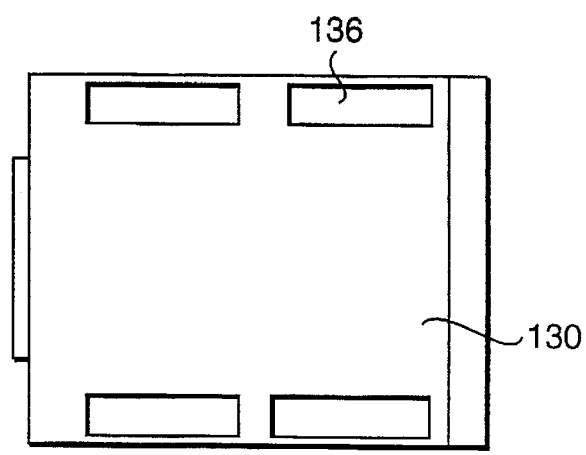

FIG. 16 shows a number (e.g., four) of air inlet ports 136 between CD-ROM section 120 and card cage section 130. These ports allow air that has entered CD-ROM section 120 to be drawn up into the card cage 130, thereby further cooling the card assemblies. Having the air enter at the bottom of DTU 100 and exit at the top of the DTU makes maximum use of the natural tendency for hot air to rise and also provides an optimum cooling path for the fan-forced air flow.

Figure 17:
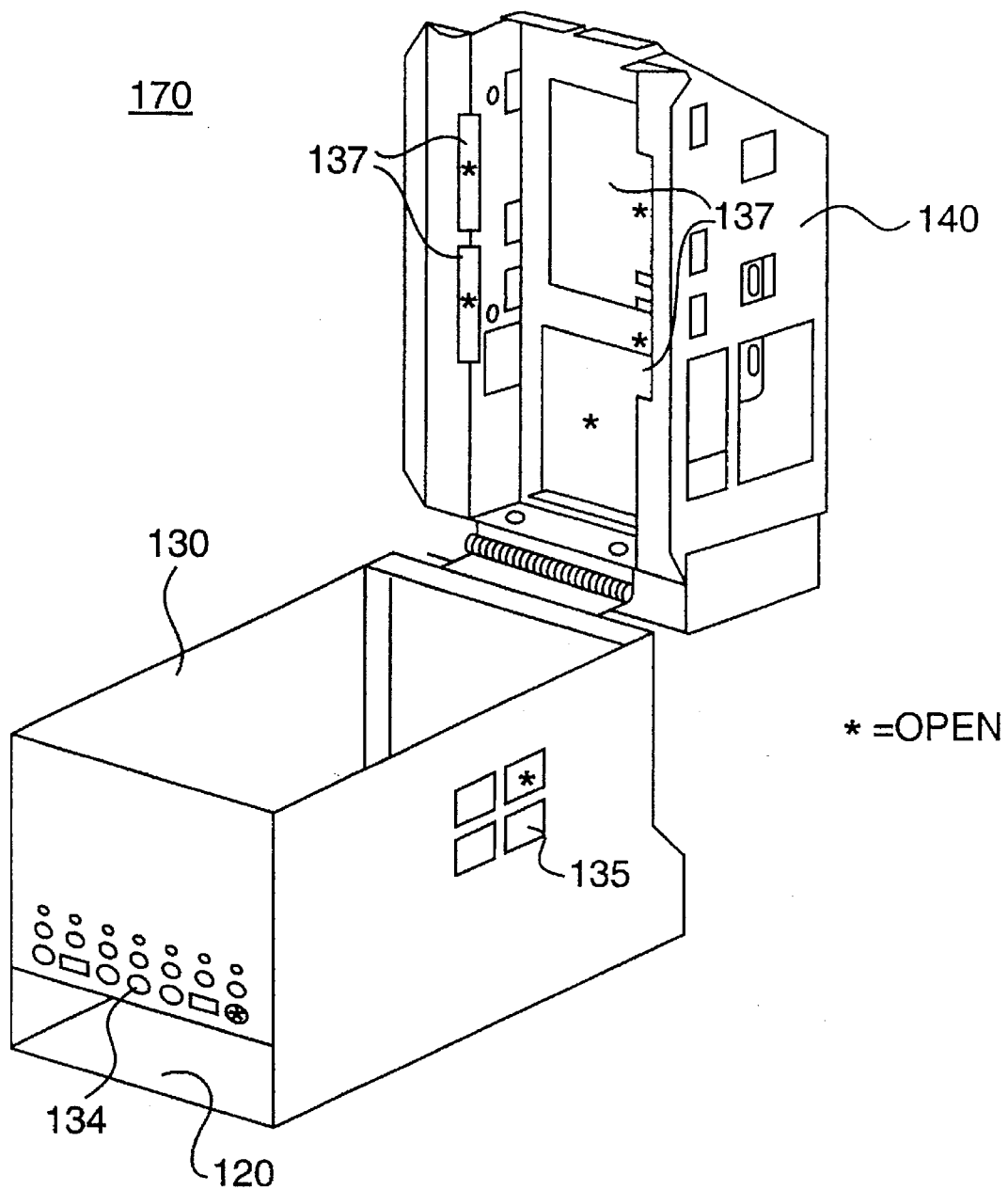
FIG. 17 is a perspective view showing the metal enclosure of the DTU with its DASD section in an open position.

FIG. 17 shows a number of air flow ports 137 located between card cage section 130 and DASD section 140. These ports are positioned between the card cage 130 and DASD section 140 to minimize the hot air flow over the DASD section by routing the air that has been heated by the CD-ROM drive and the PCBs away from the DASD section. DASD section cooling air is pulled in primarily through diskette media slot 144 (FIG. 11) and flows horizontally through DASD section 140 while hot air enters to the rear of the section away from drives 141 and 142. Cooling section 150 is designed to gather this air from all of the available input ports and paths and route it to variable-speed fan 151 located in the top and back of DTU 100.

Figure 19:
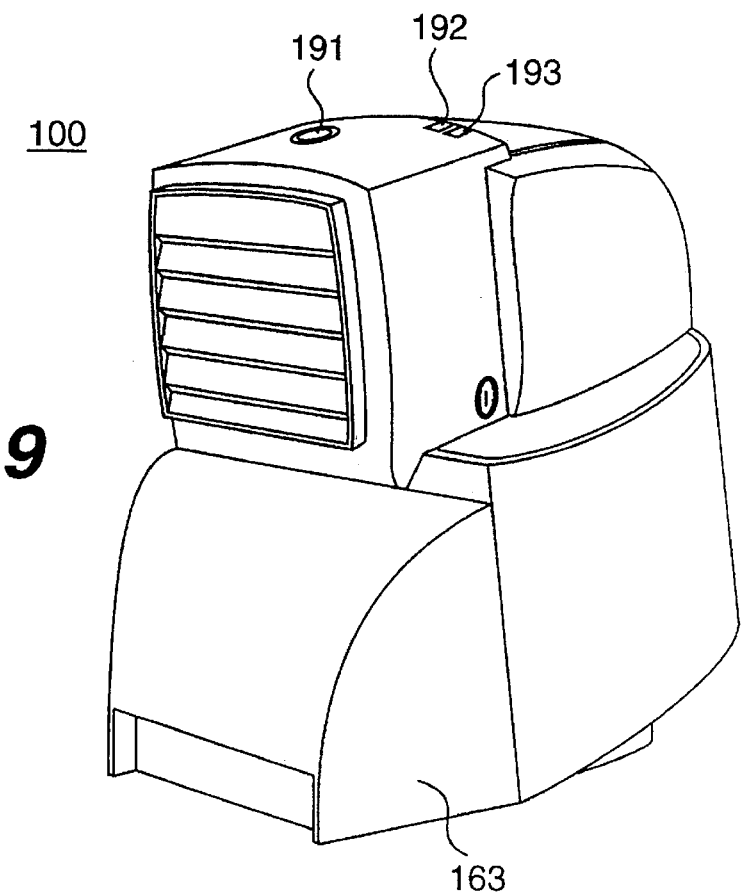
FIGS. 19 and 20 are back perspective views of the DTU with its cable cover on and off, respectively.

Another unique feature of DTU 100 is the location of the power on/off switch 191, the power indicator light 192, and the file activity light 193. These controls and indicators are provided in a very accessible and highly visible location for improved usability, as shown in FIGS. 2 and 19, for example.

Figure 18:
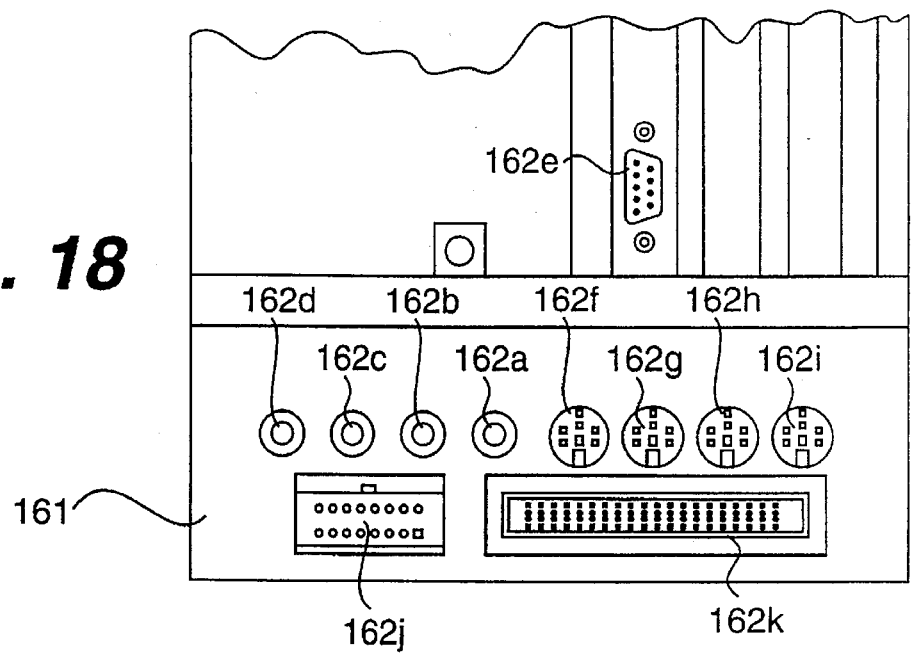
FIG. 18 is a partial back view of the DTU showing various input/output (I/O) connectors.

At the rear of DTU 100, all signals are routed to a single I/O circuit board 161 of I/O section 160 for distribution to the external devices attached to the system. The organization of this section into cable connectors intended for desktop interconnection and cable connectors intended for off-desktop distribution is unique. In this regard, the cable connectors intended for interconnection with desktop peripherals, such as headphone connector 162a, microphone connector 162b, audio-in connector 162c, audio-out connector 162d, display terminal connector 162e, auxiliary or unused connector 162f, infrared connector 162g, mouse connector 162h, and keyboard connector 162i, are directly cabled to such devices. The cable connectors intended for off-desktop distribution, on the other hand, such as DC power connector 162j and off-desktop I/O connector 162k, are routed to PSU 200. More particularly, DC power connector 162j is routed to PSU 200 where it connects to the power supply housed within the PSU, and off-desktop I/O connector 162k is routed to the PSU via SIU 300 and, at the PSU, the signals of the off-desktop I/O connector are cabled to their respective destinations. FIG. 18 shows the organization of I/O connectors 162a through 162k.

Figure 20:
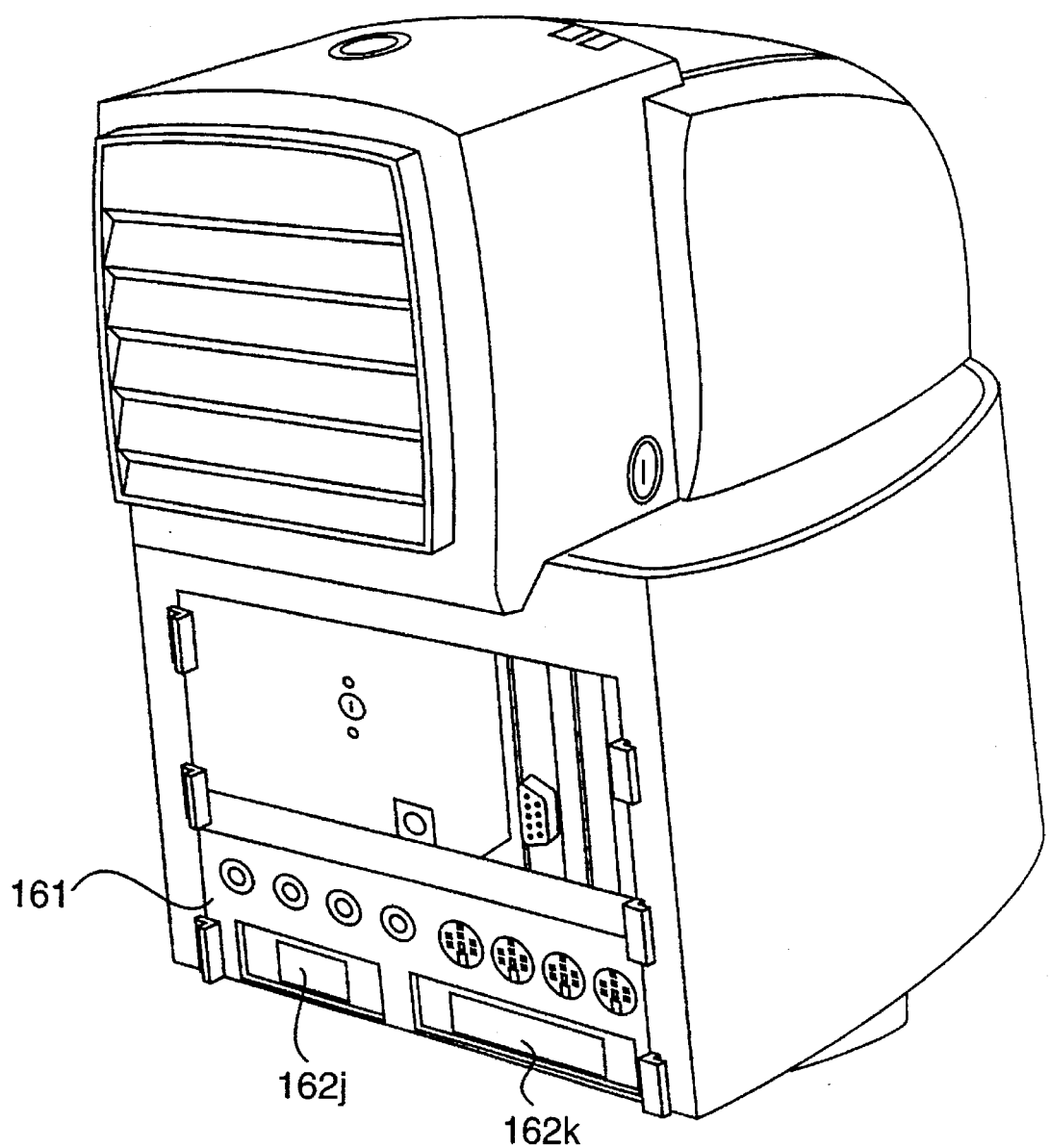

The I/O cables connected to I/O section 160 are covered by a cap 163 that provides protection for the cables against accidental disconnection and damage. It also provides a decorative element to the system design. FIG. 19 shows the cover 163 on and FIG. 20 shows the cover off.

Power Supply Unit (PSU) 200

PSU 200 is unique in that it is separate from DTU 100 and is preferably intended to be placed on the floor 800 (FIG. 1) of the work area. This gives computer system 10 the advantage of having the smallest possible unit on top of the desk 700 containing those items that require frequent user access. The remainder of the items, not requiring frequent access, are located on the floor 800 where they are out of the way.

Figure 21:
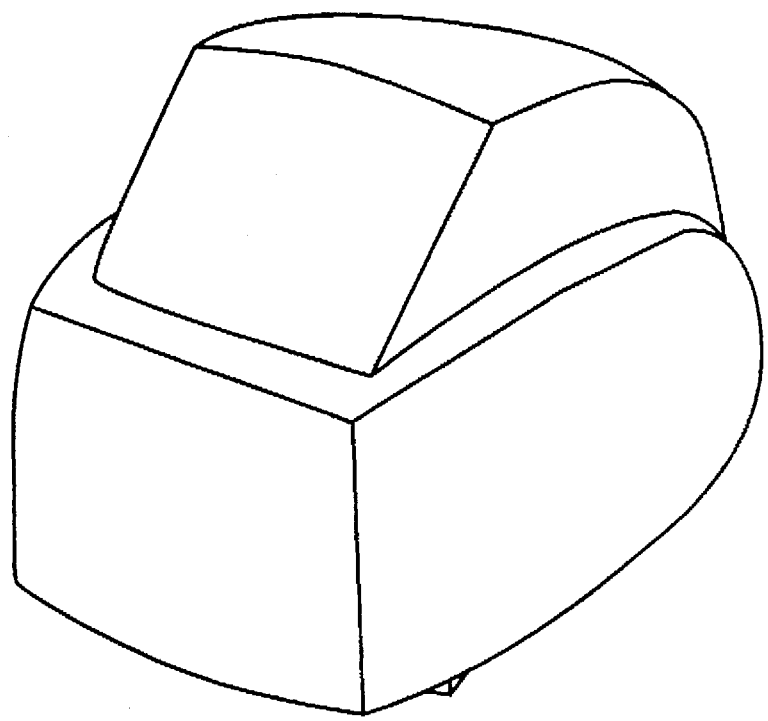
FIG. 21 is a front perspective view of the PSU.
Figure 22:
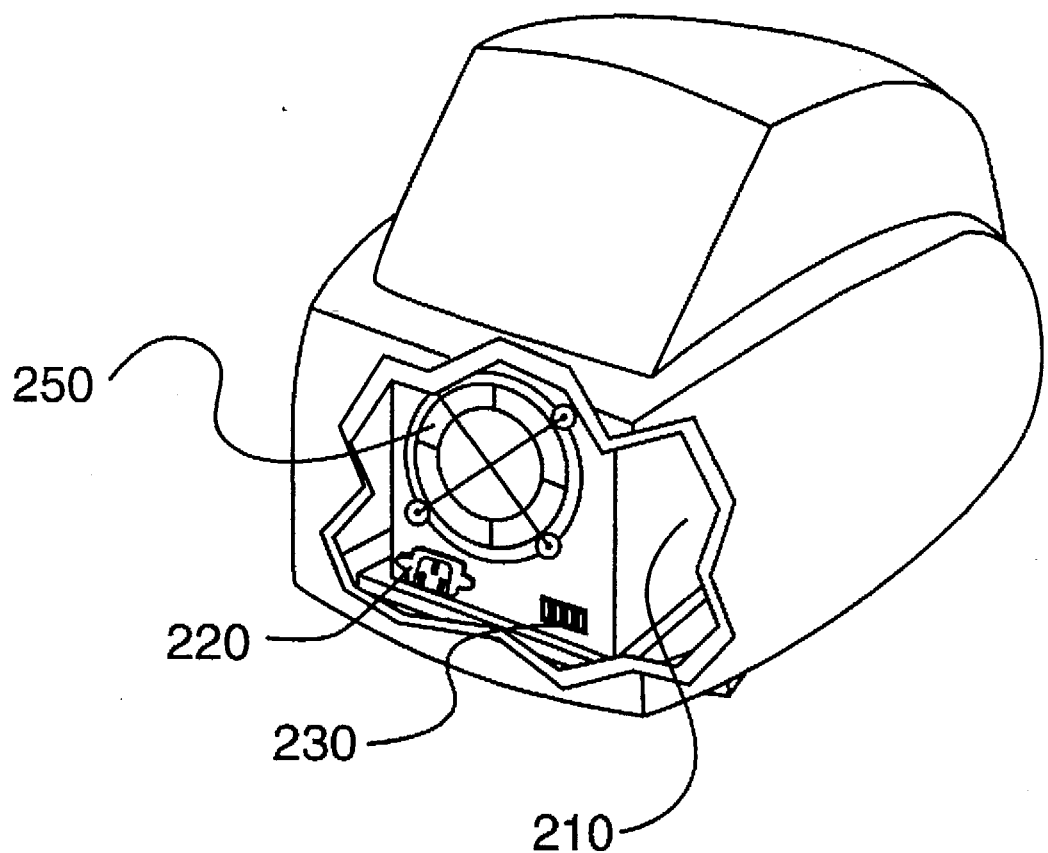
FIGS. 22 and 23 are front and back cutaway perspective views, respectively, of the PSU.

FIG. 21 shows PSU 200 viewed from the front end. FIG. 22 is a cutaway view of PSU 200 from the same angle. PSU 200 is made up of two significant parts.

The first significant part of PSU 200 is the power supply 210 itself where the alternating current (AC) power source (the power company line connection or wall outlet) is converted to the Direct Current (DC) voltage that the electronic circuits of the system require for operation. With reference to FIG. 22, the input from the AC power source is received via a cable connected to power cord connector 220, and the level of DC voltage supplied by PSU 200 to DTU 100 is selected through manipulation of a voltage-section switch 230. Having the power conversion unit separate from DTU 200 provides an additional measure of safety to the user by insuring that all voltage routed into the customer access area of the system is low voltage and defined by World Product Safety Agencies as "SAFE EXTRA LOW VOLTAGE." The design of the PSU 200 makes it impossible for the user to come into contact with hazardous power line voltages unless deliberate measures are taken to override the safety barriers that are present in the design.

Figure 23:
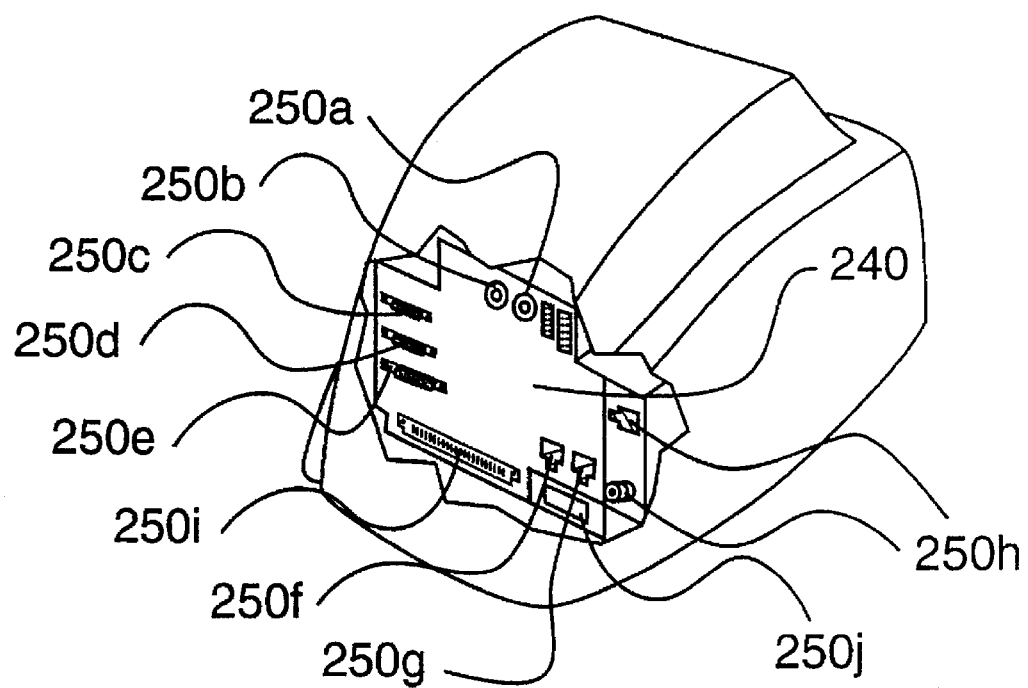

The second significant part of PSU 200 is its cable distribution board. This board removes a significant amount of the desktop cable clutter associated with conventional personal computers. I/O signals from DTU 100 are routed via SIU 300 to the cable distribution board of PSU 200 where they are fanned out to individual connectors which make up the collection of I/O cables most frequently not associated with the desktop. FIG. 23 is a cutaway view of PSU 200 from the opposite end showing the cable distribution board 240. The I/O signals from DTU 100 enter cable distribution board 240 via SIU 300. These I/O signals are then routed directly or indirectly through circuitry to the input/output connectors depicted in FIG. 23.

The cable connectors of cable distribution board 240 of PSU 200 include an audio-out (right) connector 250a, an audio-out (left) connector 250b, a serial connector 250c, a joystick/MIDI connector 250d, a parallel connector 250e, a phone connector 250f, a line connector 250g, one or more Ethernet connectors 250h, an SIU connector 250i, and a DC power connector 250j of PSU 200. DC power connector 250j is connected to DC power connector 162j of DTU 100 by a cable which may or may not be a part of SIU 300. After PSU 200 converts the AC input from the wall outlet into DC, it provides the DC power to DTU 100 on the cable connecting DC power connector 250j and DC power connector 162j. SIU connector 250i of PSU 200 is connected at its external side to off-desktop I/O connector 162k of DTU 100 by SIU 300. At its internal side, SIU connector 250i of PSU 200 is connected via cable distribution board 240 to one or more (e.g., all) of cable connectors 250a through 250h. This allows transmission of I/O signals between one or more non-desktop peripherals connected to one or more of cable connectors 250a through 250h and the PCBs 132 of DTU 100 via cable distribution board 240 of PSU 200, SIU 300, and I/O section 160 of DTU 100.

A third aspect of the separate PSU 200 is the thermal consideration given to the design. PSU 200 contains a separate cooling fan 250 (FIG. 22) used only for cooling the PSU. Conventional desktop computers rely on the power supply fan to not only cool the power supply, but also to provide a significant amount of cooling to the remainder of the system. The present invention is superior in this respect because the power supply 210 will operate much cooler than a similar power supply housed within a single-unit desktop system. Air drawn into PSU 200 is at room temperature while air drawn into a conventional computer power supply will be pre-heated by the power generated within the system electronics. Since the percentage of heat generated by the system electronics can be as much as 80 percent of the total, it is to the advantage of power supply reliability to prevent this heat from being drawn through the power supply.

An additional advantage of the separate PSU 200 is that the sound generated by PSU fan 250 is removed from the desktop and placed at a distance from the user. This makes for a much quieter environment in the office space. PSU fan 250, like DTU fan 151, is a thermally controlled fan which varies its speed through electronic controls to provide cooling as needed rather than under worst case conditions continuously. With the thermal heat load split between DTU 100 and PSU 200, each unit is able to seek the optimum fan speed for its best performance and reliability while minimizing the acoustic irritation of the environment. Conventional desktop computers that utilize thermal fan speed control have one fan carrying the load for the entire system, resulting in higher fan speeds to provide adequate cooling and thus higher acoustic environments.

Signal Interconnect Unit (SIU) 300

Figure 24:
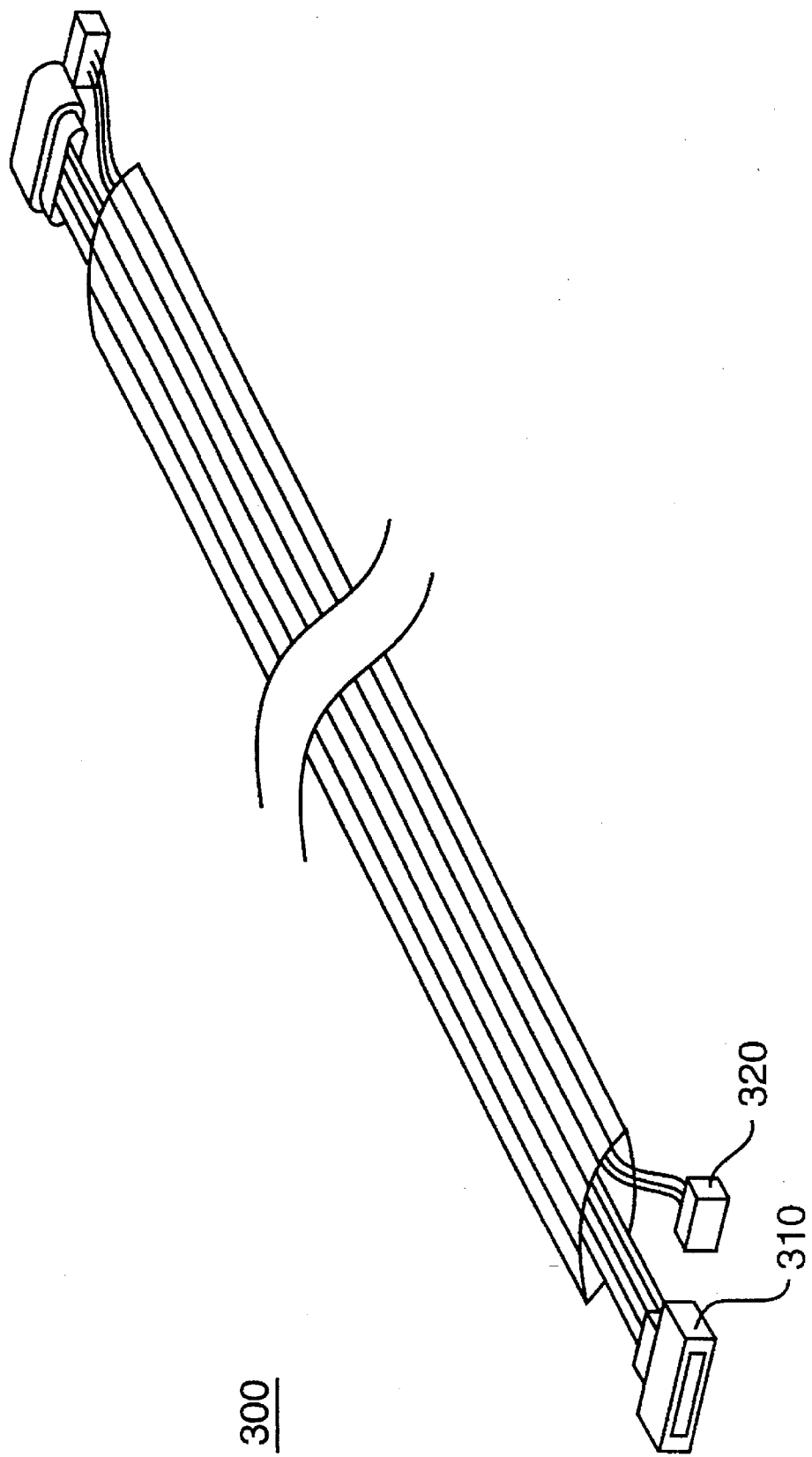

SIU 300 is a multi-signal interconnect cable or collection of cables housed within a decorative jacket that provides visual improvement to the installation as well as protection against damage or accidental disconnection of the various cables. As seen from FIG. 24, SIU 300 may include a set of cables 310 connecting I/O connector 162k of DTU 100 and SIU connector 250i of PSU 200 to allow the transmission of I/O signals therebetween, as well as a power cable 320 connecting DC power connector 162j of DTU 100 and DC power connector 250j of PSI 200 to allow the provision of DC power from PSU 200 to DTU 100. Alternatively, power cable 320 may be a separate component from SIU 300.

Figure 25:
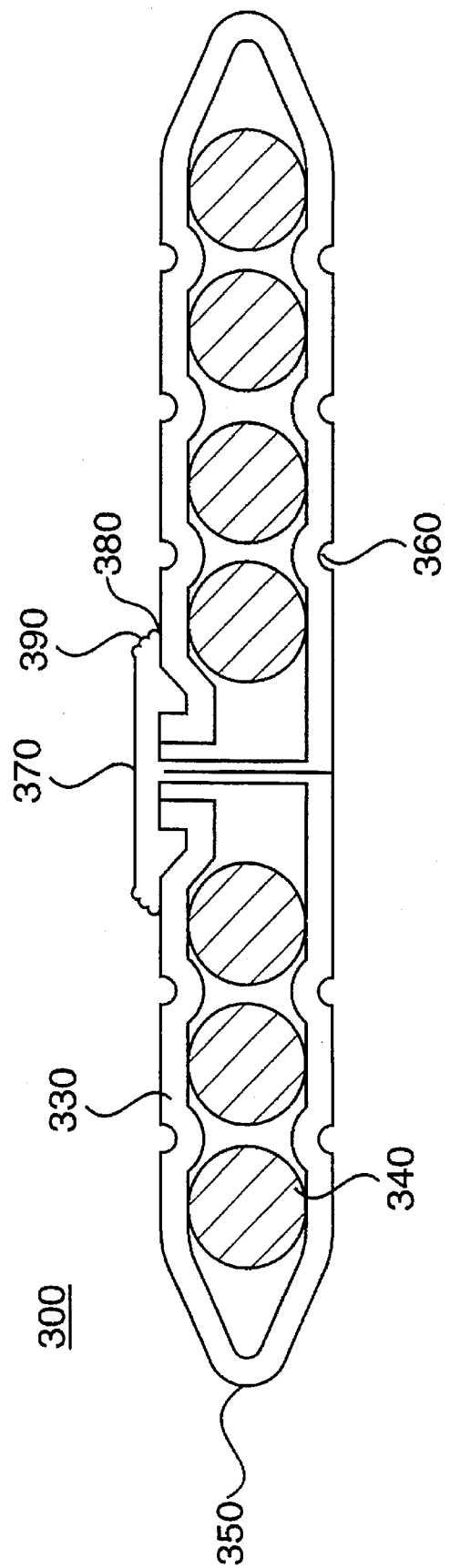
FIGS. 24 and 25 are perspective and cross-section views of the SIU, respectively.

FIG. 25 is a cross-section through SIU 300 showing an outer jacket 330 of the SIU with cables 340 routed within the jacket. Jacket 330 has tapered edges 350 that allow the cable and jacket bundle to make a sharp bend over the edge of a desk without bunching occurring at the bend, which would happen if the jacket was rectangular in cross-section. Jacket 330 also has molded-in grooves 360 that add a decorative element to the design while also providing some measure of separation between the cable channels molded into the jacket.

A central web 370 through the cross-section and running the length of jacket 330 provides further separation between different cable sections routed within the jacket. For example, in the configuration of SIU 300 depicted in FIG. 24, control web 370 could provide separation between I/O cables 310 and power cable 320. Overlapping sections of an outer surface of jacket 330 and central web 370 form a fastening arrangement 380 to allow the jacket to be opened for the addition or removal of cables 340 as needed and closed when modifications are complete. Molded-in opening ribs 390 at the opening juncture allow easy opening by peeling back the outer jacket. It is expected that opening ribs 390 would be installed in a down position for the most pleasing appearance.

In addition to cables 340 that are inserted into jacket 330 and run the total length of the jacket, provision is made for one or more of cables 340 to be routed part of the length of the jacket and then to be exited through the jacket at a location chosen by the user. In this regard, the material of jacket 330 is a soft and highly flexible polymer (e.g., extruded vinyl) which allows the user to make a small incision through the wall of the jacket (preferably at the bottom of one of the molded-in grooves 360) and to feed the end of one or more of cables 340 through the jacket wall at the point of the incision. The usefulness of jacket 330 is highly improved by this capability to customize the cable routing of a system to best fit the needs of the individual user.

It will be apparent to those skilled in the art that various modifications and variations can be made in the computer system of the present invention and in construction of this computer system without departing from the scope or spirit of the invention. As an example, the connectors connecting PCBs 132 to backplane 131 and/or the remaining connectors for the computer system, such as the connectors located at either end of SIU 300, may each be a high density connector of a type shown in, for example, U.S. application Ser. Nos. 08/381,142 filed Jan. 31, 1995, 08/209,219 filed Mar. 11, 1994, 08/208,877 filed Mar. 11, 1994, and 08/237,366 filed May 3, 1994, all of which are discussed at the beginning of this document and all of which are expressly incorporated herein by reference. Such high density connectors may have a density of approximately 100 contacts per linear inch or 152 contacts per linear inch, depending on the number of rows of contacts used in each connector.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims, and their equivalents.

What is claimed is:

1. A computer system comprising:
   a computer cabinet;
   a card cage located within the computer cabinet and having a plurality of slots;
   a plurality of printed circuit boards removably secured to the slots of the card cage, respectively, each of the printed circuit boards being marked with at least one indicator identifying a color uniquely associated with that printed circuit board; and
   a color code information label, secured within the computer system in visual proximity with respect to the slots of the card cage when one or more of the printed circuit boards is secured to corresponding slots of the card cage, for identifying a one-to-one correspondence between the slots of the card cage and the colors associated with the printed circuit boards to facilitate securement of each printed circuit board associated with a given color to the one of the slots corresponding to that color.

2. The computer system according to claim 1, wherein each of the printed circuit boards is a different color, and the different colors of the printed circuit boards serve as the indicators for the printed circuit boards, respectively.

3. The computer system according to claim 2, wherein the indicator for each printed circuit board comprises text spelling out the color uniquely associated with that printed circuit board.

4. A computer system comprising:
   a computer cabinet;
   a card cage located within the computer cabinet and having a plurality of slots;
   a plurality of printed circuit boards removably secured to the slots of the card cage, respectively, each of the printed circuit boards being marked with at least one indicator identifying a color uniquely associated with that printed circuit board and each of the printed circuit boards being marked with a graphic symbol uniquely associated with that printed circuit board to ensure suitable replacement of the printed circuit board; and
   color code means identifying a one-to-one correspondence between the slots of the card cage and the colors associated with the printed circuit boards to facilitate securement of each printed circuit board associated with a given color to the one of the slots corresponding to that color.

5. The computer system according to claim 4, wherein each of the printed circuit boards is marked with a graphic symbol and the graphic symbols serve as identifiers for the printed circuit boards, respectively.

6. The computer system according to claim 5, wherein the identifier for each printed circuit board identifies the manufacturer of that printed circuit board.

7. The computer system according to claim 5, wherein the identifier for each printed circuit board identifies the version of that printed circuit board.

8. A computer system comprising:
   a computer cabinet;
   a card cage located within the computer cabinet, said card cage including a system backplane and a plurality of slots for receiving printed circuit boards;
   a plurality of printed circuit boards removably inserted into the slots of the card cage, respectively, and pluggably connected to the system backplane, each of the primed circuit boards being marked with at least one indicator identifying a color uniquely associated with that printed circuit board; and
   a color code information label, affixed within the computer system in visual proximity with respect to the slots of the card cage, for identifying a one-to-one correspondence between the slots of the card cage and the colors associated with the printed circuit boards to facilitate securement of each primed circuit board associated with a given color to the one of the slots corresponding to that color.

9. The computer system according to claim 8, wherein the color code information label is secured within the computer system in visual proximity with respect to the slots of the card cage when one or more of the printed circuit boards is secured to corresponding slots of the card cage.

10. The computer system according to claim 9, wherein a first one of said plurality of printed circuit boards is a microprocessor board, a second one of said plurality of primed circuit boards is a memory board, and a third one of said printed circuit boards is a peripheral controller board.

* * * * *